United States Patent [19]

Ito et al.

[11] Patent Number: 5,767,559
[45] Date of Patent: Jun. 16, 1998

[54] THIN FILM TYPE PHOTOELECTRIC CONVERSION DEVICE

[75] Inventors: Hisao Ito; Yoshihiko Sakai; Hiroyuki Hotta; Kazuhiro Sakai; Hiroyuki Miyake; Tsutomu Abe, all of Kanagawa; Mamoru Nobue, Tochigi; Yasumoto Shimizu, Kanagawa, all of Japan

[73] Assignee: Fuji Xerox Co., Ltd., Tokyo, Japan

[21] Appl. No.: 463,306

[22] Filed: Jun. 5, 1995

Related U.S. Application Data

[63] Continuation of Ser. No. 886,936, May 22, 1992, abandoned.

[30] Foreign Application Priority Data

May 24, 1991 [JP] Japan ................... 3-148172
May 31, 1991 [JP] Japan ................... 3-156142

[51] Int. Cl.$^6$ ................................... H01L 27/14
[52] U.S. Cl. ................... 257/431; 257/436; 257/443
[58] Field of Search ................... 257/222, 291, 257/431, 434, 436, 443

[56] References Cited

U.S. PATENT DOCUMENTS

| | | |
|---|---|---|
| 4,099,986 | 7/1978 | Diepers . |
| 4,332,973 | 6/1982 | Sater . |
| 4,884,142 | 11/1989 | Uya ........................ 358/213.28 |
| 4,899,226 | 2/1990 | Tanimoto et al. ............ 358/483 |
| 4,908,718 | 3/1990 | Shimada .................. 358/494 |
| 4,997,773 | 3/1991 | Nobue et al. ............... 257/53 |
| 5,021,850 | 6/1991 | Tanaka et al. .............. 257/72 |
| 5,032,883 | 7/1991 | Wakai et al. ............... 257/72 |
| 5,083,175 | 1/1992 | Hack et al. ................ 257/53 |
| 5,160,835 | 11/1992 | Yagyu .................... 358/483 |
| 5,196,721 | 3/1993 | Miyake et al. ............ 250/208.1 |
| 5,286,605 | 2/1994 | Nishioka et al. .......... 250/208.1 |

FOREIGN PATENT DOCUMENTS 62-89069  4/1987  Japan .

*Primary Examiner*—Minh-Loan Tran
*Attorney, Agent, or Firm*—Finnegan, Henderson, Farabow, Garrett & Dunner, L.L.P.

[57] ABSTRACT

A thin-film type photoelectric conversion device for use in an image input unit of facsimile equipment, a scanner and the like, which uses a thin-film semiconductor as a phocondutive layer to reading not only a monochromatic image but also a color image with high resolution. A photoelectric conversion device having a photoconductive layer disposed between opposing electrodes, in which a surface facing in a direction perpendicular to a direction of film deposition of the photoconductive layer acting as a light-receiving surface.

12 Claims, 26 Drawing Sheets

↑ INCIDENT LIGHT

⇐ INCIDENT LIGHT

INCIDENT LIGHT

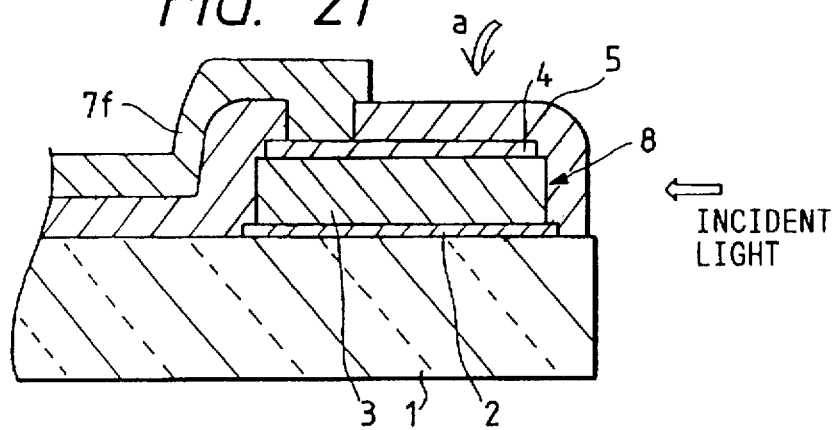
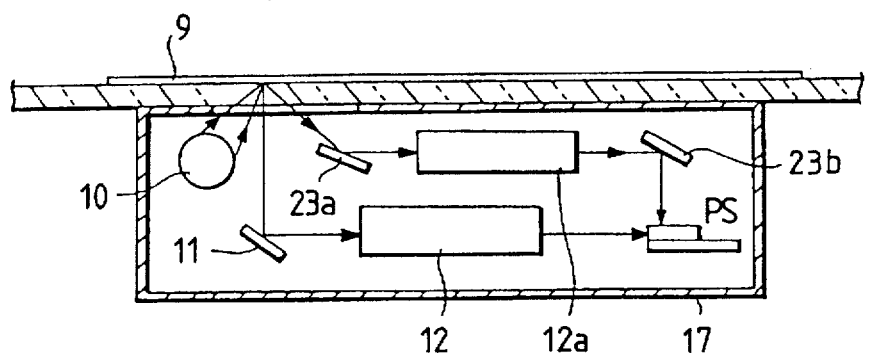
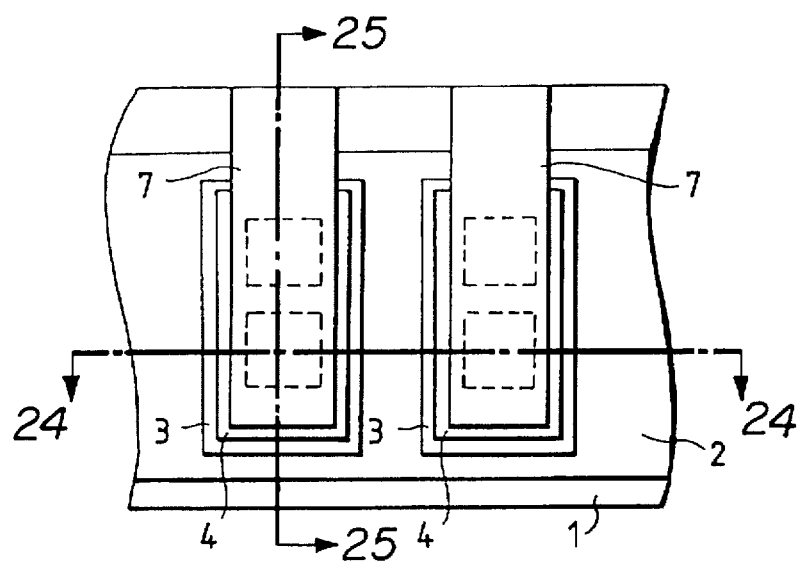

INCIDENT LIGHT ⇐

EMERGED LIGHT ⇒

INCIDENT
LIGHT
⇐

⇒
EMERGED
LIGHT

INCIDENT LIGHT

INCIDENT LIGHT

LENGTH OF PHOTOCONDUCTIVE LAYER ALONG INCIDENT LIGHT DIRECTION

THIN FILM TYPE PHOTOELECTRIC CONVERSION DEVICE

This application is a continuation of application Ser. No. 07/886,936, filed May 22, 1992, now abandoned.

BACKGROUND OF THE INVENTION

1. Field of the Invention

The present invention relates to a thin-film type photoelectric conversion device for use in an image input unit of facsimile equipment, a scanner and the like, and more particularly to a thin-film type photoelectric conversion device using a thin-film semiconductor as a phoconductive layer, which is capable of reading not only a monochromatic image but also a color image with high resolution.

2. Description of the Related Art

In recent years, the development of contact-type image sensors has been developed actively in meeting a demand for compact image input units used in facsimile equipment, scanners, or the like. In particular, the development of photoelectric conversion devices of a thin-film type, in which a thin-film semiconductor is used as a photoconductive layer, has been conducted extensively. FIGS. 1 and 2 show an example of a photoelectric conversion device of this thin-film type, in which FIG. 1 is a plan view and FIG. 2 is a cross-sectional view taken along a line R—R in FIG. 2. In the drawings, the photoelectric conversion device comprises a first electrode 81 disposed on an insulating substrate 80, a second electrode 82 disposed in face-to-face relation with the first electrode 81, and a photoconductive layer 83 interposed between the first and second electrodes 81, 82. A light-transmitting insulating layer 84 is formed on an outer peripheral surfaces of the first and second electrodes 81, 82 and the photoconductive layer 83.

Furthermore, the aforementioned first electrode 81 is connected to a third electrode 86 joined in such a manner as to cover a part of the insulating layer 84, via a communicating hole 85 formed in the insulating layer 84. The photoelectric conversion device having the above-described construction is so arranged that one surface 87 of the second electrode 82 is set as a light-receiving surface, and incident light is transmitted through the insulating layer 84 and the second electrode 82 and is made incident upon the photoconductive layer 83.

The above-described structure in which a photoconductive layer is disposed between two electrodes is generally called a sandwich structure. In the device having this sandwich structure and in a device having a conventionally known planar structure, although a description thereof will be omitted here, if an attempt is made to make high resolution, its attainable resolution is determined by how small the area of the aforementioned light-receiving surface 87 can be made. That is, if reference is had to the above-described example, the attainable resolution is determined by the accuracy of the finest processing of the first electrode 81, the photoconductive layer 83, and the second electrode 82, specifically the accuracy of patterning and etching of a resist. At present, since the patterning and etching accuracy of these resists is approximately 5 to 10 μm squares, the resolution is at most 60 to 600 dpi (42 to 32 μm pitch) or thereabouts. Hence, there have been limits to obtaining higher resolution.

As is similar to the device shown in FIG. 1, contact-type image sensors which do not use a reducing optical system have been actively developed so as to render an apparatus compact. As shown in FIG. 3, the contact-type image sensor of this type is arranged such that a multiplicity of photoelectric conversion devices of a sandwich structure are juxtaposed in each of which a square lower electrode 91 individualized for each picture element, a photoconductive layer 92 in the form of a strip, and an upper electrode 93 in the form of a strip are laminated consecutively on a glass substrate 90. In this photoelectric conversion device array, the upper electrode 93 or the lower electrode 91 is formed of a transparent conductive film, and a bias voltage common to the photoelectric conversion devices is applied to the photoelectric conversion devices via the upper electrodes 93. At the same time, reflected light from the surface of an original document (not shown) is applied to an upper or lower surface of the photoelectric conversion device array, and charges produced in the photoconductive layers 92 by the reflected light corresponding to the relative density of the original document surface are extracted as electrical signals in a time series from the individualized lower electrodes 91 via lead wires 94.

To read a color image by using the above-described contact-type image sensor, an arrangement may be provided such that, as shown in FIG. 4, red, green, and blue filters (R, G, B) are placed on top of the respective photoelectric conversion devices of the photoelectric conversion device array in a cyclically repeated manner along the direction of the array (in the main scanning direction). Alternatively, an arrangement may be provided such that, as shown in FIG. 5, the photoelectric conversion devices are arranged in three parallel rows, and red, green, and blue filters (R, G, B) in the form of strips are placed on the respective photoelectric conversion device arrays. Still alternatively, an arrangement may be provided such that the photoelectric conversion device array is provided in one row, and light sources of three colors (e.g. red, green, and blue) are used for the light for irradiating the original document surface and are selectively turned on so as to provide color-separation illumination, thereby making it possible to obtain image signals corresponding to the respective colors.

In the contact-type image sensor of the above-described structure, since the light is made incident upon the upper or lower surfaces of the photoelectric conversion devices, as described above with reference to FIGS. 1 and 2, the light-receiving area of each photoelectric conversion device is determined by the area of the individualized lower electrode 91. Accordingly, when an attempt is made to enhance the resolution, the attainable resolution is dependent upon how small the area of the lower electrode 91 can be made small. Since this lower electrode 91 is formed by photolithography and etching after deposition of a metal thin film, the resolution is determined by the fine processing accuracy through the patterning and etching of a resist.

At present, since the patterning and etching accuracy of resists is 5 to 10 μm square or thereabouts, this type sensor also has a problem in resolution, the resolution being at most 600 to 800 DPI (42 to 32 μm pitch) or thereabouts. Hence, there have been limits to obtaining a photoelectric conversion device of a thin-film structure having higher resolution.

SUMMARY OF THE INVENTION

The present invention has been devised in view of the above-described circumstances, and has as its object to provide a thin-film type photoelectric conversion device which, with a simple structure, has higher resolution than a conventional one.

Another object of the invention is to provide a structure for attaining high sensitivity in a multi-color photoelectric conversion device in which a photoelectric conversion device of a thin-film laminated structure with a photoconductive layer interposed between opposing electrodes is arranged.

The other object of the invention is to provide a photoelectric conversion device which is capable of securing a sufficient length in the direction of incidence of light and of increasing the light-absorbing efficiency, and which, when used in an image input apparatus or the like, does not present a hindrance in the production of a compact apparatus.

The above and other objects of the present invention are accomplished by the provision of a photoelectric conversion device comprising: a photoelectric means having a first surface, a second surface opposing the first surface, and a third surface not flush with the first and second surfaces; a first electrode provided to the first surface; and a second electrode provided to said second surface, the third surface having a light receiving region.

Further, they are also accomplished by the provision of a photoelectric conversion device comprising: a plurality of photoelectric conversion elements, each of which comprises a photoelectric means having a first surface, a second surface opposing the first surface, and a third surface not flush with the first and second surfaces; a first electrode provided to the first surface; and a second electrode provided to the second surface, the third surface having a light receiving region, and the light receiving regions of the respectively photoelectric conversion elements being flush with respect to each other.

Furthermore, they are accomplished by the provision of a photoelectric conversion device comprising: a photoelectric means having a first surface, a second surface opposing the first surface, and a third surface not flush with said first and second surfaces; a plurality of first electrodes provided to the first surface; and a second electrode provided to the second surface, the third surface having a light receiving region and the plural first electrodes being arranged in a direction apart from said third surface.

Accordingly, the light-receiving surface is in a direction perpendicular to the direction of deposition of the film of the photoconductive layer. In particular, among the sides which define this surface, the side in one direction is parallel with the direction of film deposition of the photoconductive layer, so that the fine processing accuracy of that side is determined by the deposition accuracy of the photoconductive layer. Since that accuracy is higher than the fine processing accuracy of a conventional light-receiving surface, i.e., the surface of the photoconductive layer in the deposition direction thereof, the resolution is enhanced by that portion, so that it is possible to provide a photoelectric conversion device with a higher resolution.

In addition, in a case where the photoelectric conversion devices in accordance with the present invention are disposed on a substrate, the light-receiving surfaces become perpendicular to the substrate. If the photoconductive layer is extended in the direction of incidence of light, i.e., in a direction parallel with the substrate, the light-absorbing efficiency can be increased by that portion. In addition, since the thickness of the substrate is not increased, no hindrance is presented in the production of a thin apparatus.

In addition, with the zigzag pattern, an additional light-receiving surface is disposed between conventional light-receiving surfaces in such a manner as to be offset laterally from a direction in which the light-receiving surfaces located on both sides thereof are juxtaposed. Such incident light that could not be otherwise captured by the light-receiving surfaces located on both sides thereof is captured by the laterally offset light-receiving surface, so that it is possible to provide a photoelectric conversion device with an improved resolution.

In addition, the photoelectric conversion devices corresponding to the respective colors of light are arranged along the direction of incidence of light, and a multi-color separation is effected by making use of the difference in the color-absorption characteristics with respect to the respective colors, it is possible to effect the reading of multi-color image information simultaneously in the same light-receiving area.

BRIEF DESCRIPTION OF THE DRAWINGS

In the accompanying drawings:

FIG. 21 is a cross-sectional view taken along line G—G in FIG. 19;

FIG. 22 is a vertical cross-sectional view illustrating a schematic arrangement of essential portions in a case where the photoelectric conversion devices in the sixth embodiment are used in the original-document reading unit;

FIG. 23 is a plan view of a seventh embodiment of the photoelectric conversion devices in accordance with the present invention;

DESCRIPTION OF THE PREFERRED EMBODIMENTS

Figure 6:
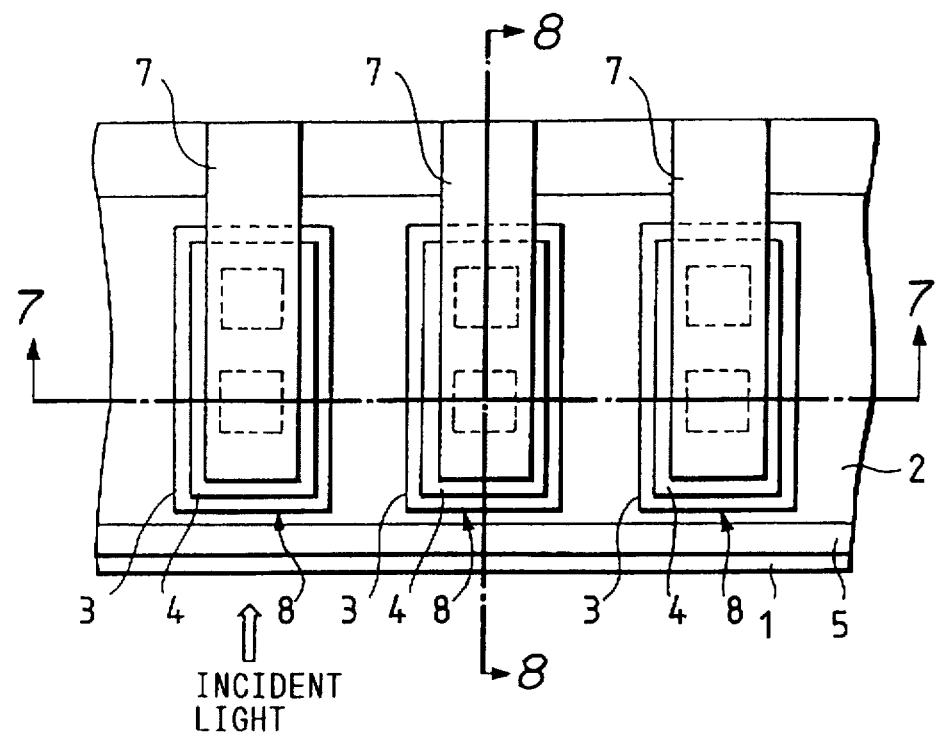
FIG. 6 is a plan view of a first embodiment of photoelectric conversion devices in accordance with the present invention.
Figure 7:
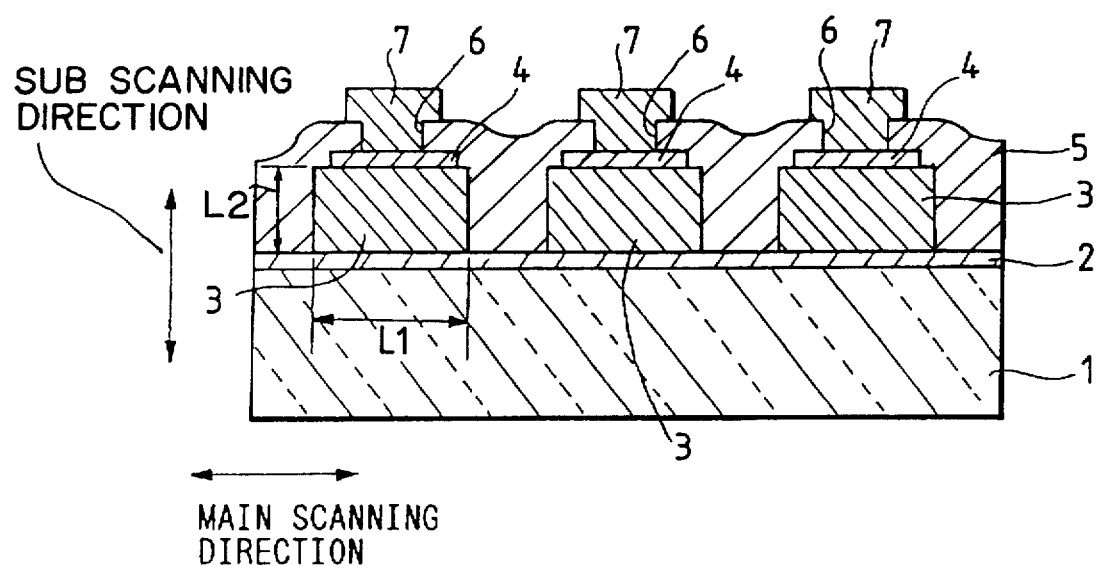
FIG. 7 is a cross-sectional view taken along line A—A in FIG. 6.
Figure 8:
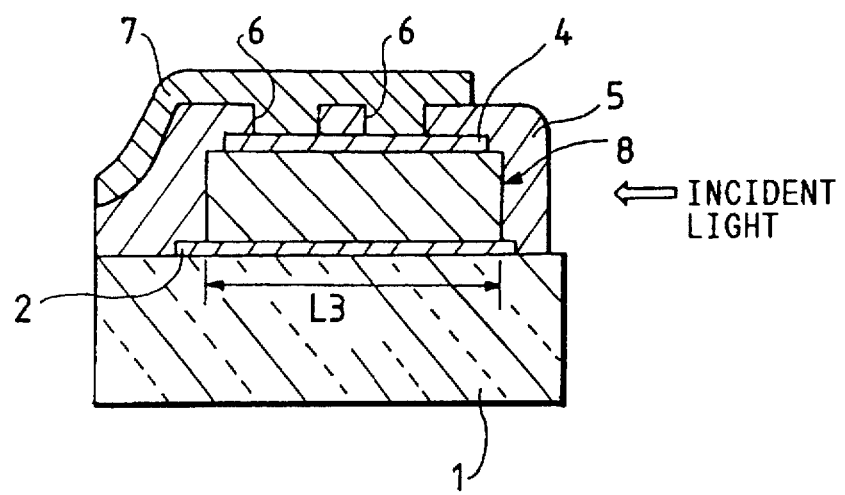
FIG. 8 is a cross-sectional view taken along line B—B in FIG. 6.

Referring to FIGS. 6 to 8, a description will be given hereafter of a first embodiment of a photoelectric conversion device in accordance with the present invention. FIG. 6 is a plan view of the photoelectric conversion devices in accordance with the first embodiment, FIG. 7 is a cross-sectional view taken along line A—A in FIG. 6, and FIG. 8 is a cross-sectional view taken along line B—B in FIG. 6.

The photoelectric conversion device in this embodiment comprises an insulating substrate 1 made of a material such as glass, a first electrode 2 made of a material such as chromium (Cr) formed in a rectangular form on this insulating substrate 1, a plurality of photoconductive layers 3 formed in a discrete manner on this first electrode 2, a second electrode 4 made of a metal such as aluminum and disposed on the photoconductive layer 3 in face-to-face relation with the first electrode 2, as described above, and an insulating layer 5 made of an insulating material such as a polyimide and covering the aforementioned insulating substrate 1, the first electrode 2, the second electrode 4, and the photoconductive layer 3. In the illustrated example, the arrangement provided is such that three photoelectric conversion devices are provided on the insulating substrate 1 along the direction of the longitudinal axis thereof. The first electrode 2 and the like constituting the photoelectric conversion device of this embodiment are formed by being consecutively laminated on the aforementioned insulating substrate 1 and through patterning.

Each of the second electrodes 4 is connected to a third electrode 7 via the insulating layer 5. That is, the third electrode 7 is joined to the insulating layer 5 and is disposed along the direction of the longitudinal axis of the second electrode 4. In addition, a contact hole 6 is formed at an appropriate position in the insulating layer 5, and the second electrode 4 and the third electrode 7 are connected to each other via this contact hole 6. It should be noted that, in this embodiment, two contact holes 6 are provided along the direction of the longitudinal axis of the second electrode 4.

The first electrode 2 in accordance with this embodiment is formed in the shape of a strip in the same manner as the insulating substrate 1, and the aforementioned photoconductive layer 3 and the second electrode 4 are arranged in such a manner that the direction of their longitudinal axes is arranged along the direction of a transverse axis of the first electrode 2. In this embodiment, one end face 8 (see FIGS. 6 and 8) of the photoconductive layer 3 in the direction of the longitudinal axis thereof is set as a light-receiving surface. As indicated by an outline arrow in FIGS. 6 and 8, incident light is made incident upon this light-receiving surface 8. In a case where the photoelectric conversion devices of this embodiment is used as an image sensor for a document reader or the like, the main scanning direction is the direction of the longitudinal axes of the insulating substrate 1 and the first electrode 2 as indicated by a solid-line arrow in FIG. 7 (horizontally as viewed in FIG. 7), and the sub scanning direction is the direction in which the first electrode 2 and the like are laminated (vertically as viewed in FIG. 8) and is similarly indicated by the solid-line arrow in the same drawing.

Here, the processing accuracy of a length Li of the light-receiving surface 8 in the horizontal direction (in the main scanning direction) is determined substantially by photolithography and etching since the processing of patterning and the like in this direction (details will be described later) is effected by photolithography and etching. Meanwhile, the processing accuracy of a length L2 (L1>L2) of the light-receiving surface 8 in the vertical direction (in the sub scanning direction) is determined substantially by a method of deposition of the photoconductive layer 3 (details will be described later), and that accuracy is 0.1 to 0.5 μm, i.e., approximately ⅒ of the processing accuracy of Li, and is high as compared with a conventional length. In addition, in the photoelectric conversion device of this embodiment, since the direction of incidence of light is perpendicular to the direction of deposition of the film of the photoconductive layer 3, as already described, a relatively large length L3 (see FIG. 8) of the photoconductive layer 3 along the direction of incidence of light can be secured as compared with a conventional length. Accordingly, it is possible to secure a sufficient length in correspondence with an extinction coefficient of the photoconductive layer 3 which is determined by a material used for the photoconductive layer 3.

Next, a description will be given of the process of manufacturing the above-described photoelectric conversion devices.

First, the insulating substrate 1 of this embodiment is formed of a glass member and, for example, Corning 7059 is used as a specific example of the glass member. A chromium (Cr) film of 500 to 1000 Å or thereabouts is deposited on the overall surface of this insulating substrate 1 by a sputtering process. Subsequently, this chromium is subjected to patterning into a predetermined configuration (in this embodiment, into the form of a strip along a leftward direction in FIGS. 6 and 7) by a photolithographic process, thereby forming the first electrode 2.

Then, a photoconductive film is allowed to be deposited on one overall surface (the surface remote from the surface to which the insulating substrate 1 is joined) of the first electrode 2 by a plasma CVD process. The photoconductive film of this embodiment is composed of p-i-n-type amorphous silicon hydride (a-Si:H), and the p-layer is prepared by subjecting a silane ($SiH_4$) gas to 1% doping with a diborane ($B_2H_6$) gas; the i-layer is prepared by using only the silane ($SiH_4$) gas; and the n-layer is prepared by subjecting the silane ($SiH_4$) gas to doping with a phosphine ($PH_3$) gas. It should be noted that the temperature of film deposition in the plasma CVD process in this embodiment is set to 200° to 250° C., and as for the thicknesses of the aforementioned p-, i-, and n-layers, the thicknesses of the p- and n-layers are set to 200 to 1000 Å or thereabouts, while the thickness of the i-layer is set to 1 to 20 μm or thereabouts.

Subsequent to the formation of the photoconductive film, an aluminum (Al) film of 500 to 1000 Å or thereabouts is deposited by the sputtering process or the vacuum deposition process, and is subjected to patterning into a predetermined configuration, i.e., such that its planar configuration (the configuration as viewed in FIG. 6) becomes rectangular as shown in FIG. 6, and the direction of its longitudinal axis becomes parallel with the direction of the transverse axis of the first electrode 2. The second electrode 4 is thereby formed.

Next, the photoconductive film formed earlier is subjected to patterning by dry etching by using the same resist pattern used in the aforementioned second electrode 4, thereby forming the photoconductive layer 3 whose planar configuration is slightly larger than that of the second electrode 4. In this dry etching, a portion projecting from the second electrode 4 in the manner of eaves is produced during side etching, and this portion is removed by providing wet etching by using the same resist pattern as the one used in dry etching.

Then, a roller coating or a spin coating of a polyimide (e.g. PIX-1400 or PIX-8803 made by Hitachi Chemical Co., Ltd. or Photoneece made by Toray Industries, Inc.) with a thickness of 1 to 5 μm thereabouts is formed thereon by the vacuum deposition process or the sputtering process, thereby forming the insulating layer 5. The contact holes 6 are formed at positions where the second electrode 4 is disposed by means of the photolithographic process. It should be noted that although in this embodiment two contact holes 6 are formed in each second electrode 4, the number thereof is not particularly restricted to the same.

Finally, an aluminum (Al) film is deposited by the sputtering process or the vacuum deposition process, and is subjected to patterning into a predetermined configuration by the photolithographic process, i.e., such that its planar configuration (the configuration as viewed in FIG. 6) becomes rectangular, and the direction of its longitudinal axis becomes parallel with the direction of the longitudinal axis of the second electrode 4 and such that the position thereof (see FIG. 6) corresponds to the position where the second electrode 4 is disposed. The third electrode 7 is thereby formed, and the photoelectric conversion device is completed.

It should be noted that although, in the photoelectric conversion device in accordance with this embodiment, the photoconductive layer 3 is of a p-i-n type, it may be of an i-type. In addition, as the material for forming the second electrode 4, indium tin oxide (ITO), chromium (Cr), or the like may be used instead of aluminum used in this embodiment. As the material for forming the insulating layer 5, silicon nitride ($SiN_x$), silicon oxide ($SiO_2$), $SiN_xO_y$, or the like may be used instead of the polyimide used in this embodiment. Furthermore, as the material for forming the first to third electrodes 2, 4, 7, a metal such as tantalum (Ta), molybdenum (Mo), nickel (Ni), tungsten (W), or the like may be used. As the material for forming the photoconductive layer 3, an a-Si compound, CdS, CdSe, an organic semiconductor, or the like, may be used.

Next, referring to FIG. 9, a description will be given schematically of an example in a case where the photoelectric conversion devices of this embodiment are used as an image sensor for an electronic copying machine or the like.

In the drawing, a schematic arrangement of essential portions of an original-document reading unit in an electronic copying machine is shown. The essential portions of the original-document reading unit in this embodiment comprise a light source 10 for radiating light to an original document 9; a main reflecting mirror 11 for introducing the reflected light from the original document 9 to photoelectric conversion devices PS; a rod-lens array 12 for introducing the light from the main reflecting mirror 11 to the photoelectric conversion devices PS; an auxiliary reflecting mirror 13 for returning to the light source 10 the reflected light, which has deviated from the optical path toward the aforementioned main reflecting mirror 11, in the reflected light from the original document 9; a read unit housing 14 for accommodating the light source 10 and the like; and platen glass 15 disposed in contact with an upper surface of this read unit housing 14. Here, the photoelectric conversion devices PS are disposed on an appropriate support member 16 with their light-receiving surfaces 8 (see FIG. 8) oriented toward the rod-lens array 12. In addition, the main reflecting mirror 11, the rod-lens array 12, the photoelectric conversion devices PS, and the support member 16 are respectively arranged on a main optical system-supporting plate 17. This main optical system-supporting plate 17 is disposed movably in a horizontal direction (in a lateral direction in FIG. 9) within the read unit housing 14 by means of a publicly well-known moving mechanism, which is not shown, and is adapted to be capable of correcting an offset of the focus occurring at the time of reading a book or the like.

Figure 1:
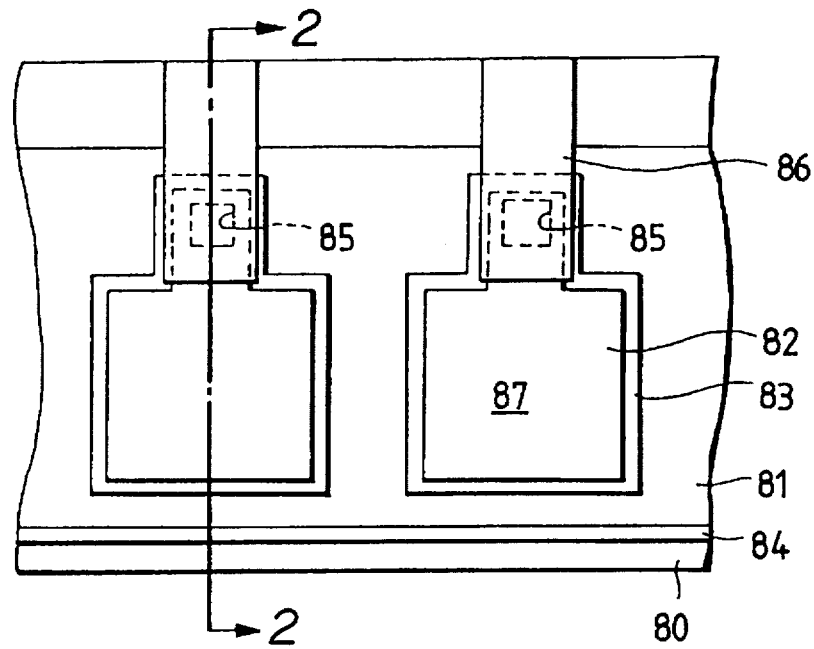
FIG. 1 is a plan view illustrating an example of conventional photoelectric conversion devices.
Figure 2:
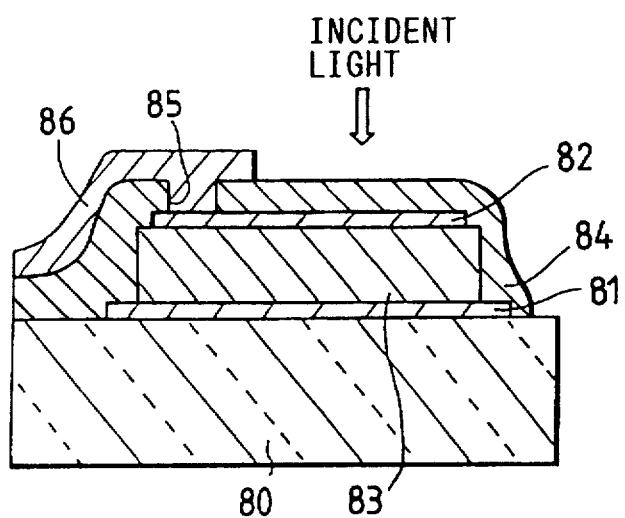
FIG. 2 is a cross-sectional view taken along line R—R in FIG. 1.

In the above-described arrangement, the light from the light source 10 is applied to the original document 9 through the opening 14a in the read unit housing 14 and the platen glass 15. The applied to the original document 9 is adapted to be reflected toward the main reflecting mirror 11 disposed in the read unit housing 14, and its optical path is changed to the horizontal direction by the main reflecting mirror 11. Then, the reflected light from the main reflecting mirror 11 is introduced to the photoelectric conversion device PS via the rod-lens array 12 disposed horizontally. Here, to describe the difference between the arrangement of the photoelectric conversion devices in the apparatus such as the one shown in this embodiment and that of a conventional apparatus, in the photoelectric conversion device in accordance with the present invention, the direction of film deposition of the photoconductive layer 3 constituting a part of the photoelectric conversion device is arranged in such a manner as to be parallel with the vertical direction (vertical direction in FIG. 9) of the read unit housing 14. In contrast, in a case where conventional photoelectric conversion devices such as those shown in FIGS. 1 and 2 are used in the original-document reading unit shown in FIG. 9, light-transmitting second electrodes 82 are arranged in such a manner as to be oriented toward the rod-lens array 12.

That is, in the case where the conventional photoelectric conversion devices are used, the second electrodes 82 whose minimum fine processing accuracy is 5 to 10 μm or thereabouts are arranged in such a manner as to be parallel with the vertical direction (vertical direction in FIG. 9) of the read unit housing. In the case where the photoelectric conversion devices in accordance with the present invention are used, the surface for receiving the incident light is not the second electrode 4, but the surface 8 facing in a direction perpendicular to the direction of film deposition of the photoconductive layer 3. Since the vertical direction of this light-receiving surface 8 is the direction of film deposition of the photoconductive layer 3, the fine processing accuracy in this direction is 1/10 or thereabouts as compared with that of the second electrode 4 which conventionally serves as the light-receiving surface. For this reason, higher resolution can be obtained.

Figure 10:
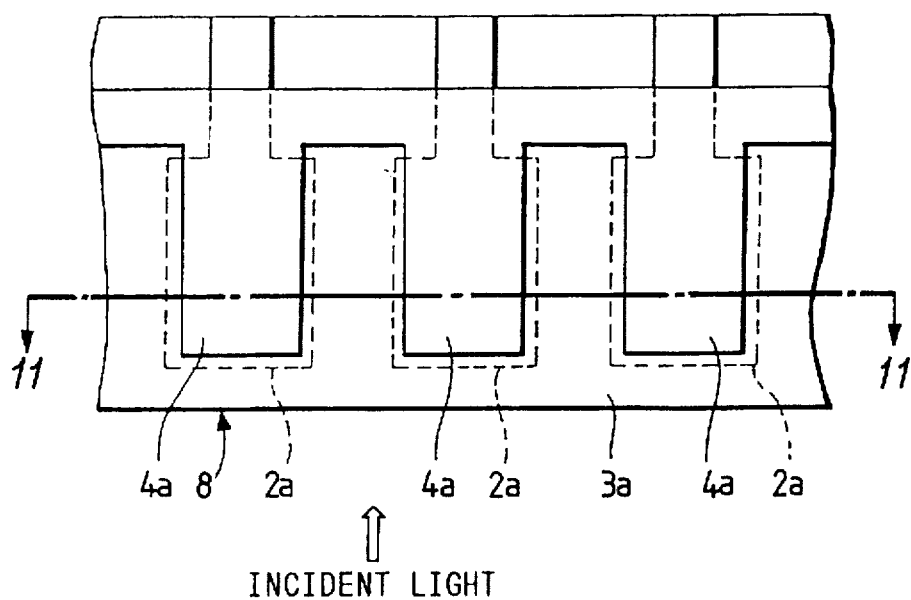
FIG. 10 is a plan view of a second embodiment of the photoelectric conversion devices in accordance with the present invention.
Figure 11:
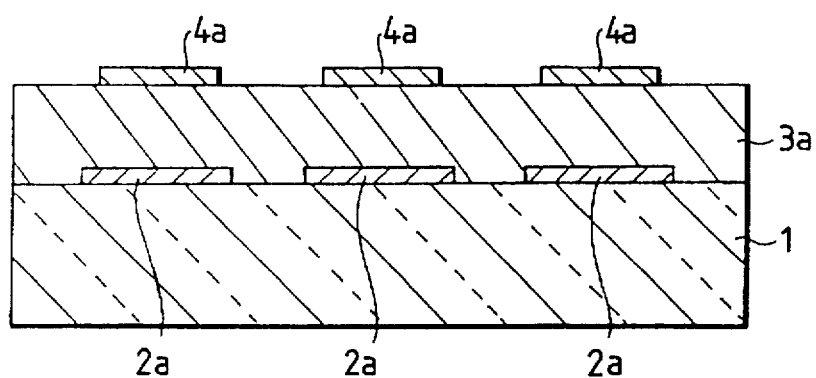
FIG. 11 is a cross-sectional view taken along line C—C in FIG. 10.

FIGS. 10 and 11 show a second embodiment, in which FIG. 10 is a plan view of the photoelectric conversion devices in accordance with the second embodiment and FIG. 11 is a cross-sectional view taken along line C—C in FIG. 10. Referring to the drawings, a description will be given hereafter of the second embodiment. It should be noted that the same constituent elements as those of the first embodiment will be denoted by the same reference numerals as those of the first embodiment, and a description thereof will be omitted. Below, a description will be given centering on differences.

This second embodiment differs from the first embodiment in that a photoconductive layer 3a is different from that of the first embodiment and is arranged continuously in the form of a strip along the insulating substrate 1, while first electrodes 2a are arranged in a discrete manner. In addition, in this second embodiment, an arrangement is provided such that since the external wiring can be connected directly to second electrodes 4a, the insulating layer 5 and the third electrode 7 which are provided in the first embodiment are not provided.

Figure 12:
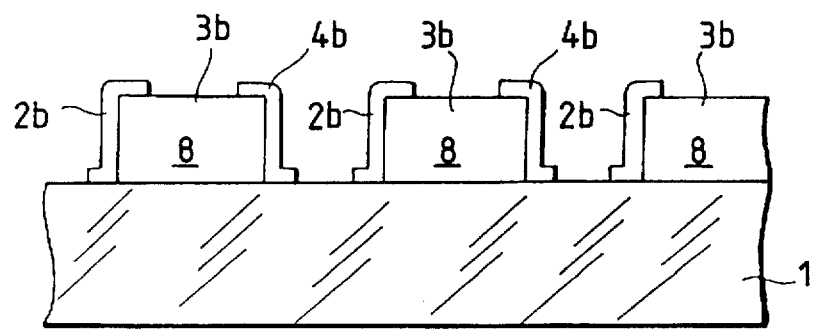
FIG. 12 is a front elevational view of a third embodiment of the photoelectric conversion devices in accordance with the present invention.

Furthermore, FIG. 12 shows a third embodiment. In this embodiment as well, the same constituent elements as those of the first embodiment will be denoted by the same reference numerals, and a description thereof will be omitted. Below, a description will be given centering on points which differ from the first embodiment. It should be noted that the drawing is a front elevational view of the photoelectric conversion devices in accordance with this embodiment.

This third embodiment differs from the first embodiment in that a photoconductive layer 3b is sandwiched between a first electrode 2b and a second electrode 4b from lateral sides thereof (horizontally in FIG. 12). Accordingly, this embodiment does not differ from the first embodiment in that the surface facing in a direction perpendicular to the direction of film deposition of the photoconductive layer 3b is set as the light-receiving surface 8. In FIG. 12 the light is received in a direction perpendicular to the plane of the drawing.

Figure 13:
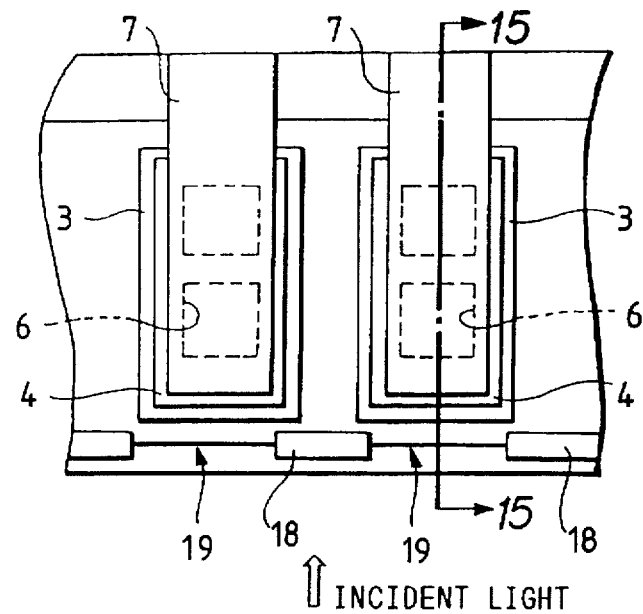
FIG. 13 is a plan view of a fourth embodiment of the photoelectric conversion devices in accordance with the present invention.
Figure 14:
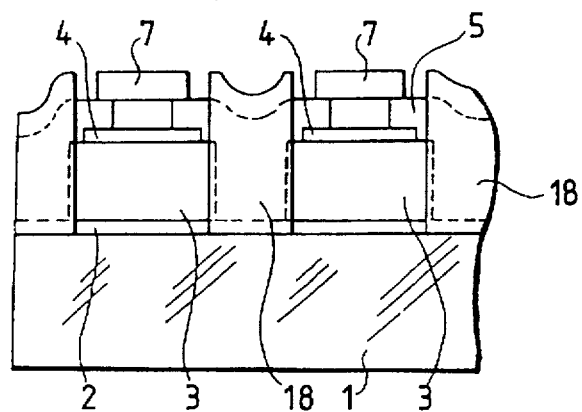
FIG. 14 is a front elevational view of the photoelectric conversion devices in the fourth embodiment.
Figure 15:
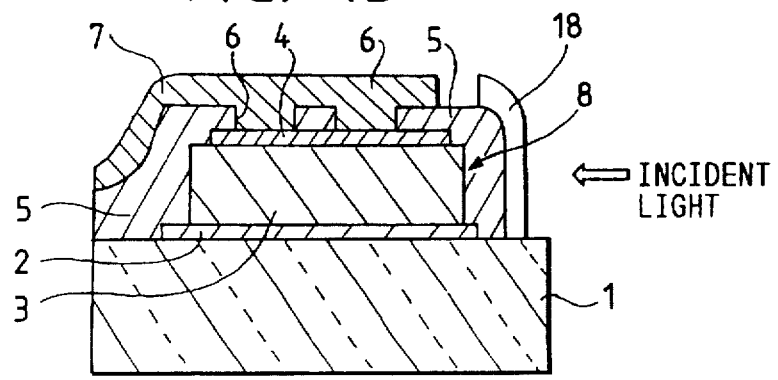
FIG. 15 is a cross-sectional view taken along line D—D in FIG. 13.

FIGS. 13 to 15 show a fourth embodiment. In this embodiment as well, the same constituent elements as those of the first embodiment will be denoted by the same reference numerals, and a description thereof will be omitted. Hereafter, a description will be given centering on points which differ from the first embodiment. It should be noted that FIG. 13 is a plan view of the photoelectric conversion devices in accordance with this fourth embodiment. FIG. 14 is a front elevational view of the photoelectric conversion devices, and FIG. 15 is a cross-sectional view taken along line D—D in FIG. 13.

In this fourth embodiment, a light-shielding layer 18 for shielding incident light is formed, and an opening 19 for introducing the incident light to the light-receiving surface 8 is formed in a portion of that light-shielding layer 18 so as to eliminate interference with the adjacent photoelectric conversion device, thereby attaining high resolution. That is, in terms of the process of producing the light-shielding layer 18, an aluminum (Al) film is first deposited by a sputtering process or the like after completion of the formation of the insulating layer 5, and the light-shielding layer 18 is then formed simultaneously with the third electrode 7 of a configuration such as the one shown in FIGS. 13 to 15 (the configuration of this third electrode 7 is the same as that of the first embodiment) by means of patterning using a photolithographic process. The light-shielding layer 18 in this embodiment is formed in such a manner as to extend from a side surface of the insulating layer 5 to an upper surface of the insulating layer 5 where the third electrode 7 is formed, as shown in FIG. 15, and the opening 19 is formed in the configuration of a slit at a position opposing the light-receiving surface 8 of the photoconductive layer 3. Accordingly, a photoelectric conversion device other than the photoelectric conversion device which should essentially receive the incident light is prevented from receiving the light due to the scattering of the light which was intended to be made incident upon the adjacent photoelectric conversion device.

Figure 16:
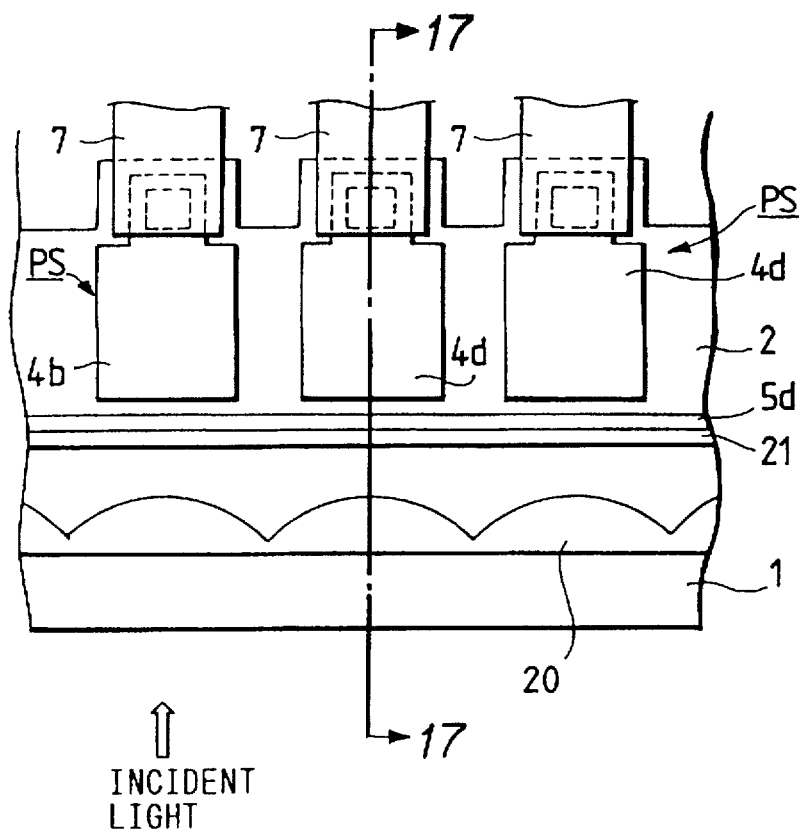
FIG. 16 is a plan view of a fifth embodiment of the photoelectric conversion devices in accordance with the present invention.
Figure 17:
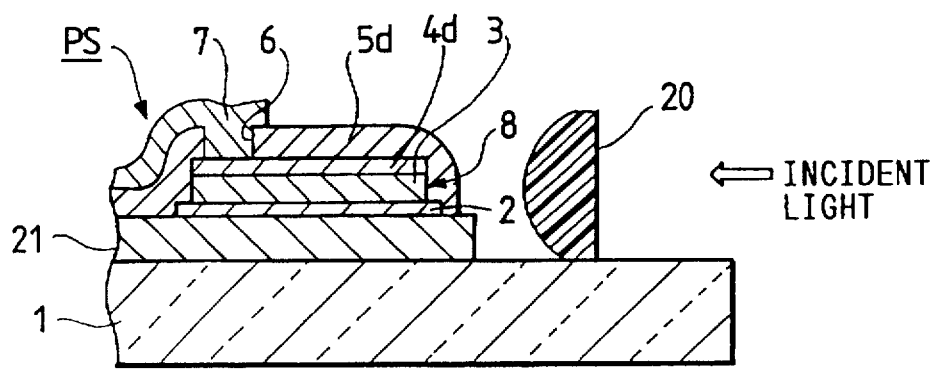
FIG. 17 is a cross-sectional view taken along line E—E in FIG. 16.

FIGS. 16 and 17 show a fifth embodiment, in which FIG. 16 is a plan view of the photoelectric conversion devices of this fifth embodiment, and FIG. 17 is a cross-sectional view taken along line E—E in FIG. 16. In this embodiment as well, the same constituent elements as those of the first embodiment will be denoted by the same reference numerals, and a description thereof will be omitted. Below, a description will be given centering on differences.

This fifth embodiment is characterized in that the photoelectric conversion device having basically the same configuration as that of the first embodiment is provided. That is, a microlens 20, serving as a lens means, is disposed at a position spaced apart a predetermined distance from the light-receiving surface 8 of the photoelectric conversion device. The arrangement provided is such that the light made incident from the front side (from the right-hand side in FIG. 17) of the microlens 20 is focused exactly on the light-receiving surface 8 via the microlens 20.

In the photoelectric conversion device of this embodiment, a lower insulating layer 21 is formed between the first electrode 2 and the insulating substrate 1, and one contact hole 6 is provided in an upper insulating layer 5d (corresponding to the insulating layer 5 in the first embodiment).

In the aforementioned lower insulating layer 21, the lower insulating layer is formed at a predetermined position on the insulating substrate 1 by using a metal mask, and a silicon oxide film with a thickness of 1.2 μm or thereabouts is deposited by using an RF sputtering process. In addition, the film thickness of the first electrode 2 of this embodiment is set to 1500 Å or thereabouts, the film thickness of the photoconductive layer 3 is set to 3 μm or thereabouts, the film thickness of a second electrode 4d is set to 600 Å or thereabouts, and the film thickness of the upper insulating layer 5d is set to 1.3 Å or thereabouts.

FIGS. 18(a) to 18(d) show an explanatory diagram explaining an outline of the process of fabricating the microlens 20, and a description will be given hereafter of the details with reference to the drawing. It should be noted that the drawing is a side elevational view of the photoelectric conversion device of this embodiment.

Figure 18A:
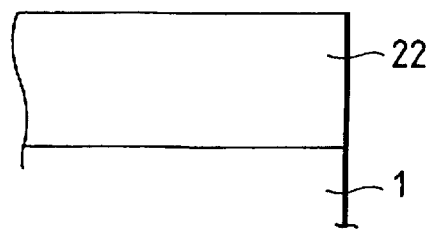
FIGS. 18(a)–18(d) are the explanatory diagram explaining the process of fabricating a microlens provided for the photoelectric conversion device in accordance with a fifth embodiment.
Figure 18B:
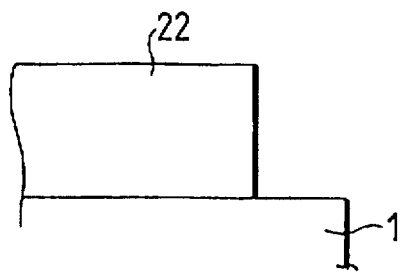
Figure 18C:
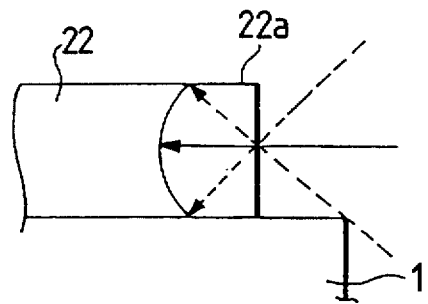
Figure 18D:
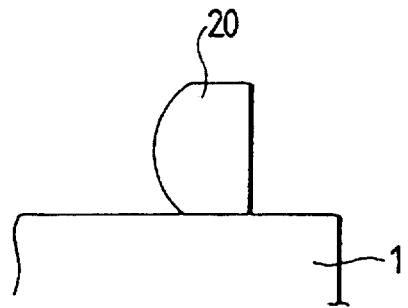

The formation of the microlens 20 of this embodiment is effected after forming the photoelectric conversion devices PS on the insulating substrate 1. First, an acrylic resin dissolved in a solvent is applied to the insulating substrate 1, thereby forming a resin layer 22 (see FIG. 18(a)). Subsequently, the resin layer 22 is subjected to patterning by photolithographic etching in such a manner that a portion thereof at a position where the microlens 20 is provided as well as its peripheral portion are left (see FIG. 18(b)). Then, an electron beam (a solid-line arrow and dotted-line arrows in FIG. 18(c)) is radiated from the side (in the direction from the right-hand side toward the left-hand side in FIG. 18(b)) which becomes the direction of incidence of the light when the microlens 20 is completed, so as to harden the resin layer 22 into a predetermined configuration (in this embodiment, into the configuration of a convex lens as shown in FIG. 18(c)), thereby forming a resin-hardened portion 22a (see FIG. 18(c)). Finally, an excess portion of the resin layer 22 other than the resin-hardened portion 22a is removed by means of a dissolving solution, thereby completing the microlens 20.

Figure 9:
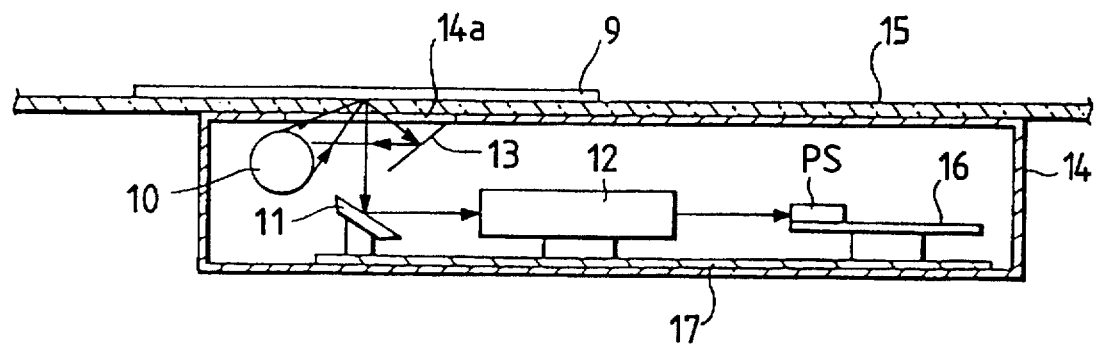
FIG. 9 is a vertical cross-sectional view illustrating a schematic arrangement of essential portions in a case where the photoelectric conversion devices shown in the first embodiment are used in an original-document reading unit.

If the microlens-integrated type photoelectric conversion devices of this embodiment are used for the original-document reading unit of such as the electronic copying machine having the configuration shown in FIG. 9, instead of the photoelectric conversion devices of the first embodiment, the optical path length (in FIG. 9, the distance from the main reflecting mirror 11 to the photoelectric conversion devices PS) can be reduced substantially. Hence, the apparatus can be made compact and thin.

Figure 19:
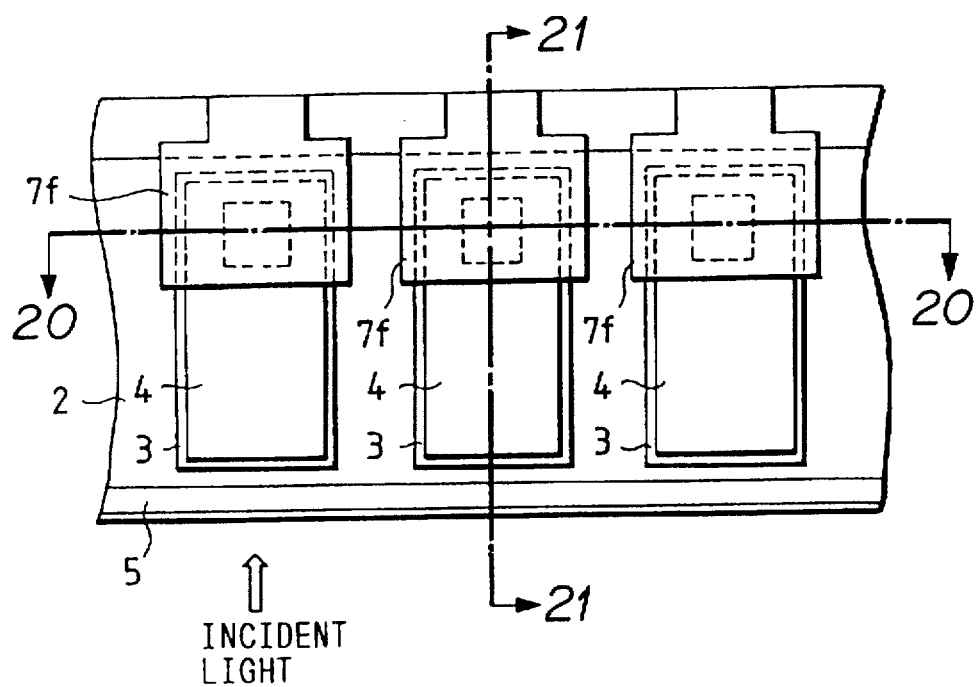
FIG. 19 is a plan view of a sixth embodiment of the photoelectric conversion devices in accordance with the present invention.
Figure 20:
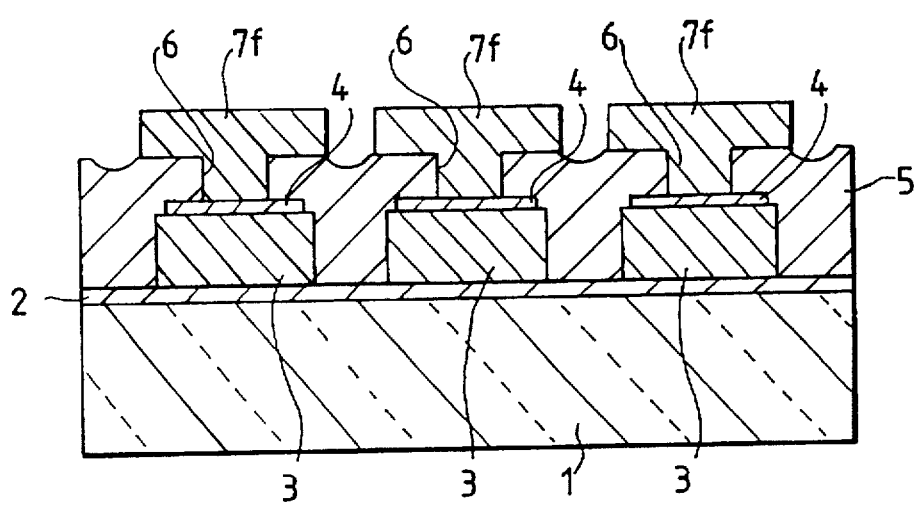
FIG. 20 is a cross-sectional view taken along line F—F in FIG. 19.

Next, FIGS. 219 to 21 show a sixth embodiment, in which FIG. 19 is a plan view of the photoelectric conversion devices of this embodiment, FIG. 20 is a cross-sectional view taken along line F—F in FIG. 19, and FIG. 21 is a cross-sectional view taken along line G—G in FIG. 219. In this embodiment as well, the same component elements as those of the first embodiment will be denoted by the same reference numerals, and a description thereof will be omitted. Below, a description will be given centering on differences.

The photoelectric conversion device of this embodiment is characterized in that the surface 8 facing in a direction perpendicular to the direction of film deposition of the photoconductive layer 3 is set as the light-receiving surface, and that the surface facing in the direction of film deposition of the photoconductive layer 3 is also set as the light-receiving surface. That is, the second electrode 4 is a transparent electrode composed of a light-transmitting material such as indium oxide or tin, and is capable of receiving light from the direction of the upper surface of each photoelectric conversion device (in the direction indicated by outline arrow a in FIG. 21) as well. It should be noted that since the second electrode 4 and a third electrode 7f overlap in the vertical direction (in the vertical direction in FIG. 21), the light-receiving area of the second electrode 4 is restricted by the third electrode 7f by that portion.

FIG. 22 shows an example in which the photoelectric conversion devices of the sixth embodiment are used in an original-document reading unit similar to the one shown in FIG. 9. The same constituent elements as those shown in FIG. 9 will be denoted by the same reference numerals, and a description thereof will be omitted. Below, a description will be given of differences. First, in this example, two auxiliary reflecting mirrors, i.e., first and second auxiliary reflecting mirrors 23a, 23b, are provided, and an auxiliary rod-lens array 12a is provided. In addition, in the same way as the embodiment shown in FIG. 9, the photoelectric conversion devices PS are each arranged such that the surface 8 facing in a direction perpendicular to the direction of film deposition of the photoconductive layer 3 is oriented horizontally, i.e., in the direction of the rod-lens array 12, and that the second electrode 4 is oriented in the vertical direction (in the vertical direction in FIG. 22).

Then, the first auxiliary reflecting mirror 23 reflects horizontally (horizontally in FIG. 22) the light which has deviated from the main optical path heading toward the main reflecting mirror 11 in the reflected light from the original document 9, and this reflected light in arranged to be introduced to the second auxiliary reflecting mirror 23b via the auxiliary rod-lens array 12a. The light made incident upon this second auxiliary reflecting mirror 23b is reflected toward the photoelectric conversion devices PS located vertically (vertically in FIG. 22). Accordingly, that reflected light is made incident from the direction of the upper surface of the second electrode 4 of the photoelectric conversion device PS (in the direction of outline-arrow a in FIG. 21). It should be noted that the main reflected light from the original document 9 is received by the light-receiving surface 8 of the photoelectric conversion device PS.

Accordingly, in the photoelectric conversion devices of this sixth embodiment, since the arrangement is provided such that the light can be received from the two directions, the light from the main optical path is received by the light-receiving surface 8 which is an end face of the photoelectric conversion device, as described above, while the electrode (in this embodiment, the second electrode 4) side is set as another light-receiving surface in a conventional manner, so that the light which has deviated from the main optical path can be received via an optical path separate from the main optical path. Hence, it is possible to attain higher sensitivity of the devices. It should be noted that the photoelectric conversion devices of this embodiment are not necessarily to be used in the manner shown in FIG. 22, and an arrangement may, of course, be provided such that only either one of the two light-receiving surfaces may be used.

Figure 24:
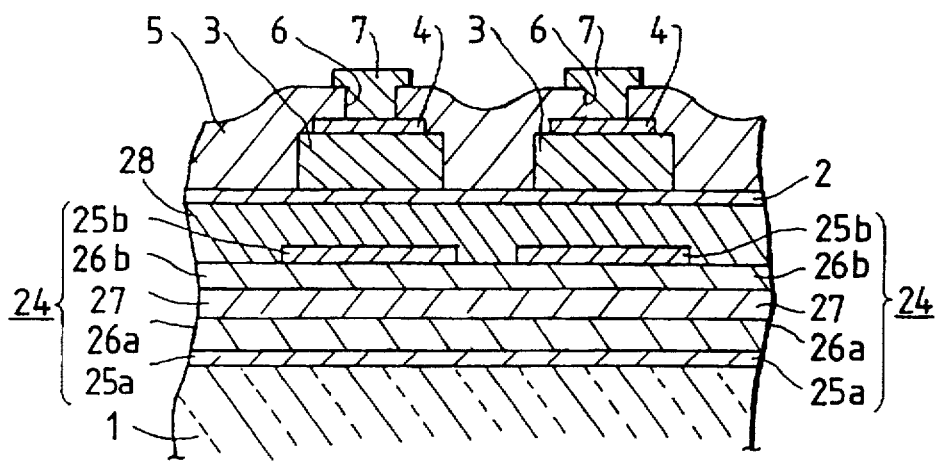
FIG. 24 is a cross-sectional view taken along line H—H in FIG. 23.
Figure 25:
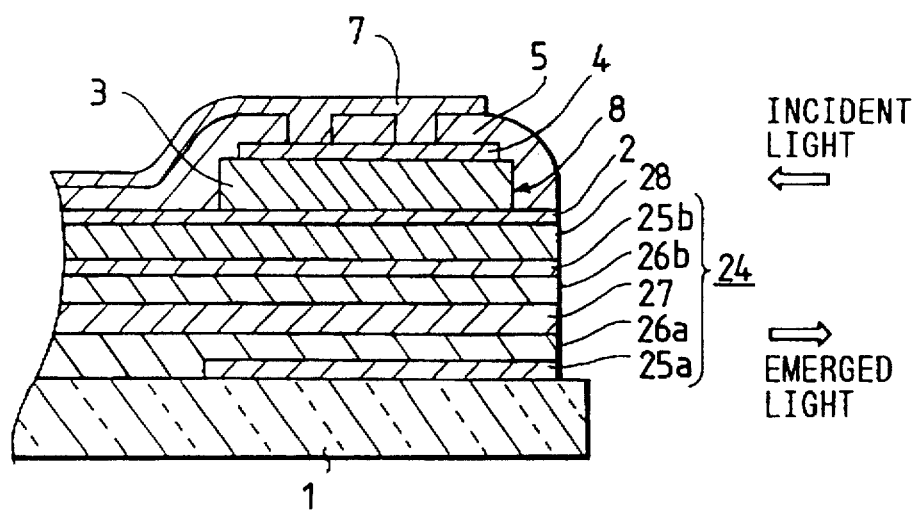
FIG. 25 is a cross-sectional view taken along line I—I in FIG. 23.

FIGS. 23 to 25 show a seventh embodiment, in which FIG. 23 is a plan view of the photoelectric conversion devices in the seventh embodiment, FIG. 24 is a cross-sectional view taken along line H—H in FIG. 23, and FIG. 25 is a cross-sectional view taken along line I—I in FIG. 23. Below, the same component elements as those of the first embodiment will be denoted by the same reference numerals, a description thereof will be omitted, and a description will be given centering on differences. The photoelectric conversion device in this embodiment differs from that of the first embodiment in that the light-emitting element is provided integrally. That is, the photoelectric conversion devices are each formed in a laminated structure by forming a light-emitting element 24 on the insulating substrate 1 and by forming the photoelectric conversion device PS thereon, as shown in FIGS. 24 and 25. The light-emitting element 24 is used as a light source for irradiating the original document (the details of a method of use will be described later).

The light-emitting element 24 of this embodiment is arranged such that a light-emitting first electrode 25a, a light-emitting second electrode 26a, a light-emitting layer 27, a light-emitting second insulating layer 26b, and a light-emitting second electrode 25b are laminated consecutively on the insulating substrate 1. The arrangement provided is such that reflection is repeated by interfaces between the light-emitting layer 27, sandwiched between the electrodes 25a, 25b, and the insulating layers 26a, 26b, and the light is finally made to emerge from a side end (a right-hand side surface in FIG. 25). It should be noted that a plurality of light-emitting second electrodes 25b in this embodiment are disposed in a discrete manner, and are electrically connected to each other outside the photoelectric conversion devices, so that the light-emitting second electrodes 25b are adapted to be maintained at the same potential. Accordingly, when the light-emitting elements 24 are driven, the individual elements 24 are not made to emit light consecutively one at a time, but all the light-emitting elements 24 are arranged to emit light simultaneously. For this reason, instead of providing the plurality of light-emitting second electrodes 25b in a discrete manner as in this embodiment, the light-emitting second electrode may be provided continuously in the form of a strip as in the case of the light-emitting first electrode 25a.

To describe the process of fabricating this light-emitting element 24, first, the light-emitting first electrode 25a is formed by depositing a film of aluminum (Al) or the like by a sputtering process. In this embodiment, the light-emitting first electrode 25a is formed in the configuration of a strip in a direction perpendicular to the plane of FIG. 25 and in such a manner as to be shorter than the length of the transverse axis of the insulating substrate 1 in the direction of the transverse axis of the insulating substrate 1 (in the horizontal direction in FIG. 25).

The light-emitting first insulating layer 26a is formed by depositing a film of a dielectric material such as silicon nitride ($Si_3N_4$) on the above-described light-emitting first electrode 25a and the insulating substrate 1 by means of a sputtering process or a CVD process. Then, the light-emitting layer 27 is formed thereon in the configuration of a strip by depositing a film of such as ZnS:Mn or ZnS:TbF$_3$ by means of EB deposition or the sputtering process. The light-emitting second insulating layer 26b is formed by depositing a film of a dielectric material such as $Si_3N_4$ by the sputtering method or the CVD process in the same way as the above-described light-emitting first insulating layer 26a. In addition, the light-emitting second electrodes 25b are each formed by depositing a film of aluminum (Al) or the like by means of the sputtering process in the same way as the above-described light-emitting first electrode 25a. It should be noted that the plurality of light-emitting second electrodes 25b are provided in a discrete manner in correspondence with the positions of the photoelectric conversion devices PS (see FIG. 24).

After the light-emitting element 24 is formed, a separating insulating layer 28 composed of a polymer such as a polyimide or a material such as SOG is formed on top of the light-emitting second electrode 26b. The photoelectric conversion devices PS are formed thereon through a manufacturing process such as the one described already in the first embodiment.

Figure 26:
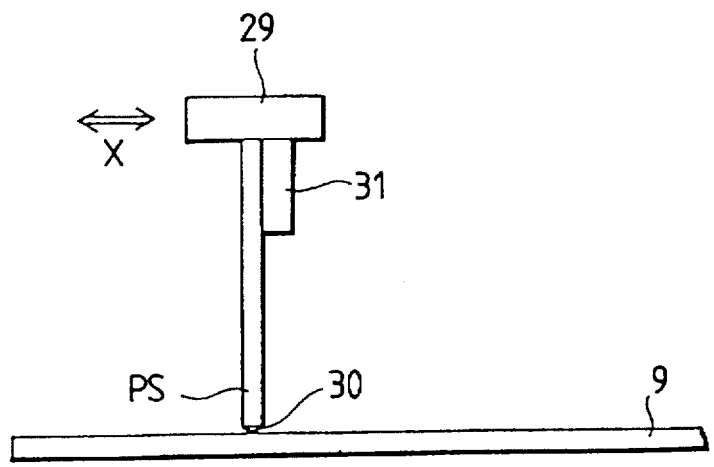
FIG. 26 is a schematic diagram illustrating a schematic arrangement of essential portions in a case where the photoelectric conversion devices shown in the seventh embodiment are used in the original-document reading unit.
Figure 27:
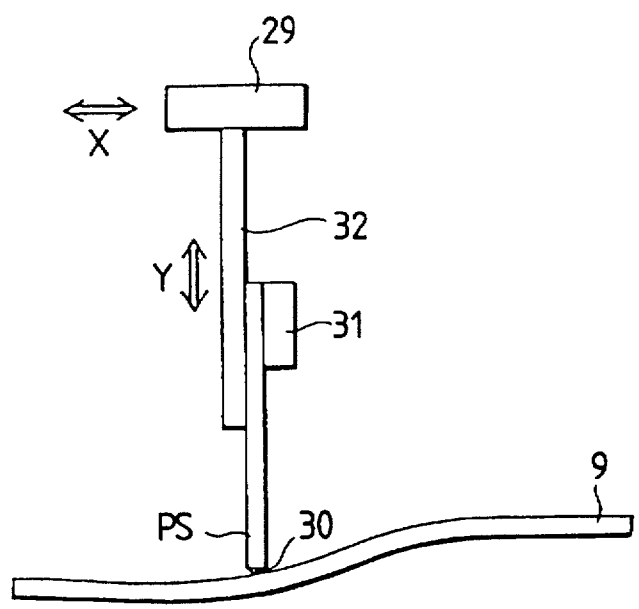
FIG. 27 is a schematic diagram illustrating a schematic arrangement in a case where a vertical movement mechanism is added in the apparatus having the arrangement shown in FIG. 26.
Figure 28:
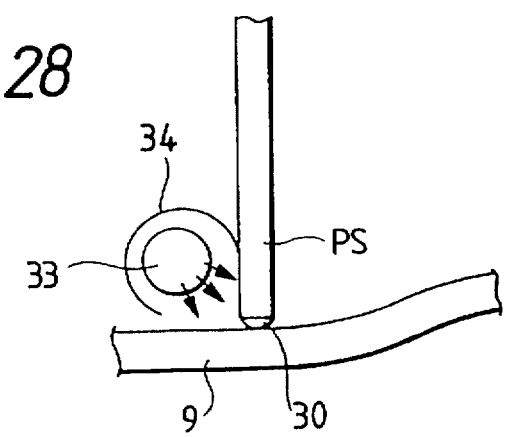
FIG. 28 is a schematic diagram illustrating an example in which a portion of the applied example shown in FIG. 26 is modified.

FIGS. 26 to 28 are schematic diagrams of examples in which the above-described light-emitting-element-integrated type photoelectric conversion devices are used in an original-document reading unit. A description will be given hereafter of these examples.

First, FIG. 26 shows an example in which the photoelectric conversion devices shown in FIGS. 23 to 25 are used as a contact-type image sensor. The photoelectric conversion devices PS are mounted on a horizontal movement mechanism 29 such that their end faces (surfaces on the side where the light-receiving surfaces 8 are located) are oriented in the lower direction (in the lower direction in FIG. 26), i.e., in such a manner as to be oriented toward the original document 9. This horizontal movement mechanism 29 moves the photoelectric conversion devices PS in the horizontal direction, i.e., in the sub scanning direction (in the direction of outline arrow X in FIG. 20), and is a mechanism which has a publicly well-known arrangement. In addition, a protective film 30 for protection is formed on the end faces of the photoelectric conversion devices PS (including an end face of the light-emitting element 24), and prevents the end faces of the photoelectric conversion devices PS and the light-emitting element 24 from damage or the like. The original document 9 is placed on an unillustrated plate-like member in a state in which the original document 9 substantially abuts against the protective film 30. It should be noted that an IC 31 for an interface with the photoelectric conversion devices PS and the light-emitting element 24 is mounted on the horizontal movement mechanism 29.

In the above-described arrangement, the horizontal movement mechanism 29 moves over the surface of the original document 9 at a predetermined speed, and in that moving process light is emitted from the light-emitting element 24 in the lower direction in FIG. 26 and is applied to the original document 9. Then, the reflected light of a quantity of light corresponding to the relative density of the original document 9 is produced toward the light-receiving surface 8 of the photoelectric conversion device PS. As the photoelectric conversion device PS captures the reflected light from the original document 9 with its light-receiving surface 8, the reading of the original document is effected.

FIG. 27 shows a schematic arrangement of the original-document reading unit which is further provided with a vertical movement mechanism 32 in the example shown in FIG. 26 described above. That is, the vertical movement mechanism 32 basically has an arrangement similar to that of the above-described horizontal movement mechanism 29, and the photoelectric conversion devices PS of this embodiment in which the light-emitting element is provided integrally are mounted on a movable section (not shown) of this vertical movement mechanism 32. In addition, the vertical movement mechanism 32 is fixed to the horizontal movement mechanism 29 in such a manner that the direction of movement of that movable section becomes a vertical direction (the direction of outline arrow Y in FIG. 21), i.e., a direction perpendicular to the horizontal direction (the direction of outline arrow X in FIG. 27) which is the direction of movement of the horizontal movement mechanism 29. According to this arrangement, even if the original document 9 such as a book is not flat in the horizontal direction and is undulating vertically, as shown in FIG. 27, the vertical movement mechanism 32 is capable of moving the photoelectric conversion devices PS of this embodiment in the vertical direction in correspondence with the undulation of the or signal document 9 detected by an unillustrated sensor. Thus, even in there is an undulation in the original document, it is possible to accurately read the image on the original document surface.

Unlike the example shown in FIGS. 23 to 25, FIG. 28 is an example in which the light-emitting element is not formed integrally, and a light source 33 (e.g., constituted by a lamp, an LED, or the like) separate from the photoelectric conversion devices PS, together with a light-shielding plate 34, is attached on outer surfaces of the photoelectric conversion devices PS and is made movable together with the photoelectric conversion devices PS. It should be noted that unillustrated remaining constituent portions may be arranged in the manner shown in either FIG. 26 or FIG. 27.

In addition, in a case where the light source 33 is disposed in spaced-apart relationship from the end faces (sides where the light-receiving surfaces 8 are located) of the photoelectric conversion devices PS, i.e., in a case where the light source 33 is disposed at an upper position in FIG. 22 in spaced-apart relationship from the original document 9, if the insulating substrate 1 is composed of a light-transmitting material such as glass and the insulating substrate 1 is arranged to be located on the side (left-hand side in FIG. 29) where the light source (not shown in FIG. 29) is disposed, the light from the light source reaches the original document 9 after passing through a corner portion 35 of the insulating substrate 1. Thus it is possible to compensate for the lack of the quantity of light incident upon the surface of the original document due to the fact that the light source is spaced apart from the original document 9.

Figure 29:
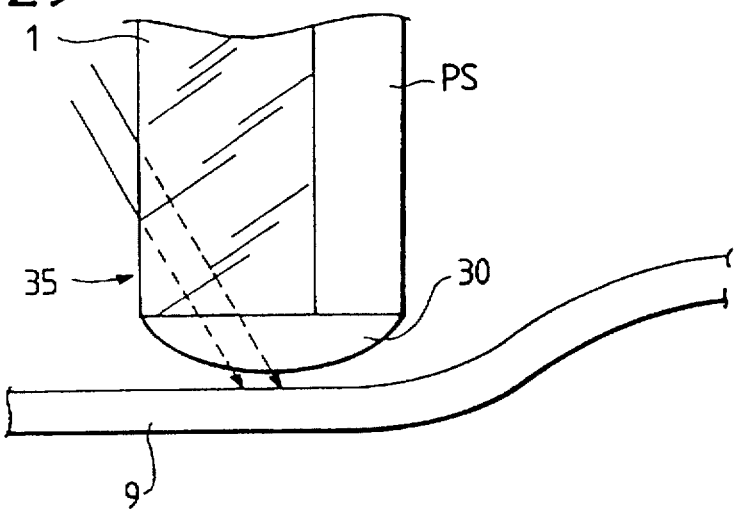
FIG. 29 is an enlarged front elevational view of a vicinity of an original document-side tip of the photoelectric conversion device in the applied example shown in FIG. 28.
Figure 30:
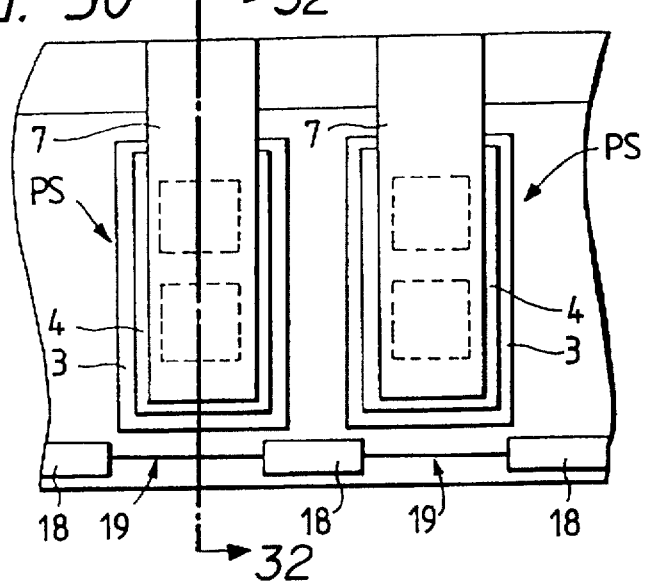
FIG. 30 is a plan view of an eighth embodiment of the photoelectric conversion devices in accordance with the present invention.
Figure 31:
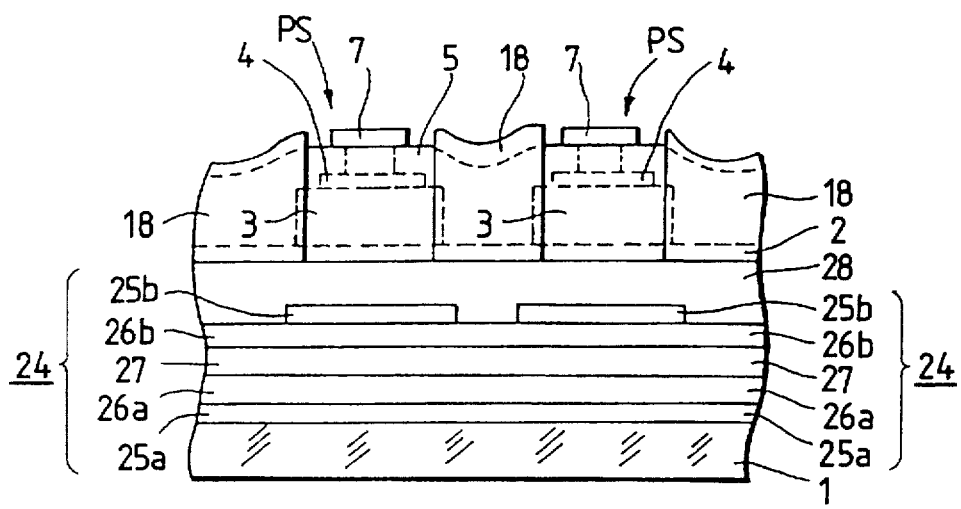
FIG. 31 is a front elevational view of the photoelectric conversion devices in accordance with the eighth embodiment.
Figure 32:
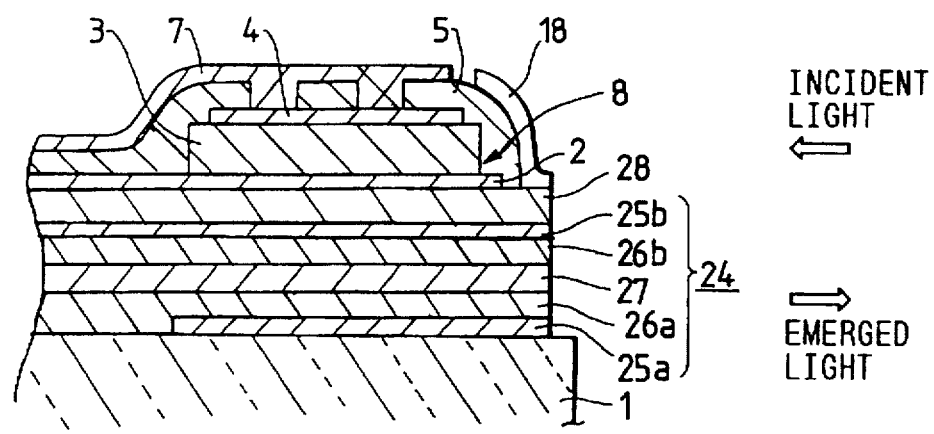
FIG. 32 is a cross-sectional view taken along line J—J in FIG. 30.

As an eighth embodiment, FIGS. 30 to 32 show an example in which a light-shielding layer which is basically similar to the one shown in FIGS. 13 to 15 is provided in the photoelectric conversion devices of the type in which the light-emitting element described with reference to in FIGS. 23 to 25 is formed integrally therewith. Here, FIG. 30 is a plan view of the photoelectric conversion devices of this embodiment, FIG. 31 is a front elevational view of the photoelectric conversion devices of this embodiment, and FIG. 32 is a cross-sectional view taken along line J—J in FIG. 30. The same constituent elements as those of the first embodiment described with reference to FIGS. 12 to 14, the fourth embodiment described with reference to FIGS. 19 to 21, and the seventh embodiment described with reference to FIGS. 29 to 31 will be denoted by the same reference numerals, and a description thereof will be omitted. Hereafter, a description will be given of the photoelectric conversion device of this embodiment centering on points which differ from these embodiments.

The photoelectric conversion device of this embodiment is characterized in that an insulating layer similar to the one described with reference to FIGS. 19 to 21 is formed in the photoelectric conversion device of the type in which the light-emitting element described with reference to FIGS. 29 to 31 is integrated. That is, the light-shielding layer 18 is basically formed in front of the light-emitting surface 8 (on the right-hand side in FIG. 32) with the insulating layer 5 disposed therebetween in the same way as described with reference to FIGS. 19 to 21, and the opening 19 (see FIG. 30) is formed at a position thereof facing the light-receiving surface 8.

The light emitted from the light-emitting element 24 is applied to an unillustrated original document, is reflected by that original document, and becomes the light made incident upon the photoelectric conversion device PS. This incident light reaches the light-receiving surface 8 via the opening 19 formed in the light-shielding layer 18, but the light leaking to adjacent photoelectric conversion devices is shielded by the light-shielding layer 18, so that no effect is given to the generation of photoelectric current in the adjacent photoelectric conversion devices. For this reason, in the photoelectric conversion device of this embodiment, since the light-emitting element is formed integrally therewith, in a case where the photoelectric conversion devices of this embodiment are used in the original-document reading unit or the like, there is no need to separately provide a light source for irradiating the original document. Since the space which would otherwise be required in the disposition thereof can be saved, the apparatus can be made compact. In addition, since the light-shielding layer 18 having the opening 19 is provided in face-to-face relation with the light-receiving surface 8 of the photoelectric conversion device, only the necessary light is made incident upon the light-receiving surface 8 through the opening 19. Hence, cases where the light which should be made incident upon the adjacent photoconductive layer is made incident are practically nil, so that the resolution improves.

Figure 33:
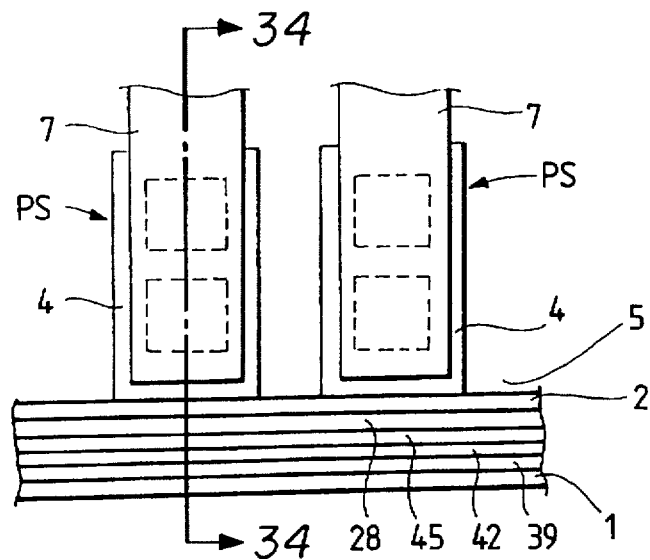
FIG. 33 is a plan view of a ninth embodiment of the photoelectric conversion devices in accordance with the present invention.
Figure 34:
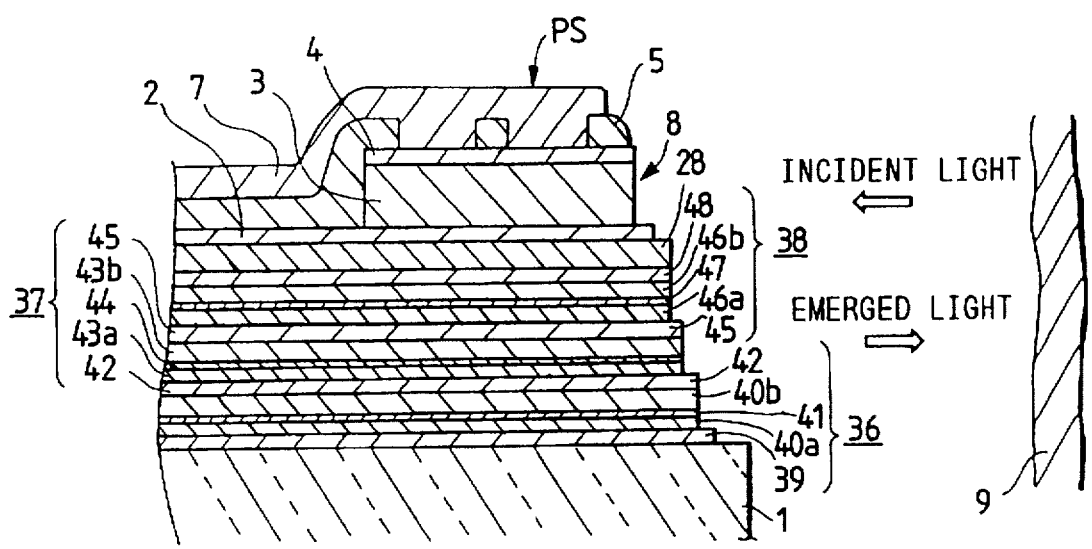
FIG. 34 is a cross-sectional view taken along line K—K in FIG. 33.

FIGS. 33 and 34 show a ninth embodiment, in which FIG. 33 is a plan view of the photoelectric conversion devices of this embodiment, and FIG. 34 is a cross-sectional view taken along K—K in FIG. 33.

Hereafter, a description of the photoelectric conversion device of this embodiment will be given with reference to these drawings, but the same constituent elements as those of the first embodiment shown in FIGS. 6 to 8 will be denoted by the same reference numerals, and a description thereof will be omitted. Below, a description will be given centering on differences.

This embodiment is particularly characterized in that color-type light-emitting elements are adopted in the photoelectric conversion device in which the light-emitting elements are formed integrally therewith.

That is, in this embodiment, after a red light-emitting element 36, a green light-emitting element 37, and a blue light-emitting element 38 are laminated, the photoelectric conversion device PS having basically the same arrangement as that shown in the first embodiment is further laminated thereon via the separating insulating layer 28.

The three light-emitting elements 36, 37, 38 themselves in this embodiment are not particularly novel and have the publicly well-known arrangements. Here, a detailed description thereof will be omitted, and only a rough configuration thereof will be given. First, the red light-emitting element 36 is arranged such that a red light-emitting layer 41 sandwiched between insulating layers 40a, 40b for light emission is disposed on a light-emitting first electrode 39, and a light-emitting second electrode 42 is further disposed thereon.

The green light-emitting element 37 has its light-emitting second electrode 42 commonly shared by the red light-emitting element 36, and is arranged such that a green light-emitting layer 44 sandwiched between insulating layers 43a, 43b for light emission is disposed between this second electrode 42 and a light-emitting third electrode 45. Furthermore, the blue light-emitting element 38 has its light-emitting third electrode 45 commonly shared by the green light-emitting element 37, and a blue light-emitting layer 47 sandwiched between insulating layers 46a, 46b for light emission in a manner similar to the one described above is disposed between this third electrode 45 and a light-emitting fourth electrode 48. It should be noted that it goes without saying that the order of lamination of the respective light-emitting elements 36, 37, 38 described above is not particularly restricted to that of this embodiment.

In the above-described arrangement, a brief description will be given of the operation in a case where the photoelectric conversion devices are used for an image sensor. In the same way as the seventh embodiment described with reference to FIGS. 23 to 25, the light-emitting elements 36, 37, 38 emit light from the surfaces facing in a direction (in the horizontal direction in FIG. 34) perpendicular to the direction of lamination of the light-emitting elements 36, 37, 38, this light is applied to the original document 9 disposed in the vicinity thereof, and the light reflected therefrom is made incident upon the light-receiving surface 8 of the photoelectric conversion device PS, thereby effecting the reading of the original document.

Here, as for the order in which the light-emitting elements 36, 37, 38 are driven, first, a predetermined driving voltage is applied across the light-emitting first electrode 39 and the light-emitting second electrode 42 so as to cause the red light-emitting element 36 to emit light. Subsequently, a predetermined driving voltage is applied across the light-emitting second electrode 42 and the light-emitting third electrode 45 so as to cause the green light-emitting element 37 to emit light. Then, a predetermined driving voltage is applied across the light-emitting third electrode 45 and the light-emitting fourth electrode 48 so as to cause the blue light-emitting element 38 to emit light. Thereafter, the light-emitting elements 36, 37, 38 are consecutively made to emit light in the aforementioned order in a circulatory manner.

Meanwhile, in each photoelectric conversion device PS, charges occurring due to the incident light are stored in the order in which the above-described light-emitting elements 36 to 38 are driven, and outputs are sequentially delivered in a time series by an unillustrated driving IC via the second electrode 4 to the third electrode 7 which are individualized for respective picture elements. It should be noted that since the method of reading signals from the photoelectric conversion devices PS is already publicly well-known, a detailed description will be omitted here.

In addition, it is preferred that portions of the photoelectric conversion devices PS and the light-emitting elements 36, 37, 38 are covered with, for instance, a polyimide, sheet glass, or the like so as to be provided with a protective layer, although not shown in FIGS. 33 and 34.

If a comparison is made between the photoelectric conversion device of this embodiment and a conventional one, a structure in which light is emitted in the direction of lamination (upwardly in FIG. 34) of the light-emitting elements is adopted in a conventional so-called full-contact-type image sensor. For this reason, if color-type photoelectric conversion devices are to be made, at least a red light-emitting element, a green light-emitting element, and a blue light-emitting element, i.e., a total of three light-emitting elements, are required to be juxtaposed in the same plane for each picture element. As a result, the arrangement of the wiring to be connected to each light-emitting element becomes complicated, thereby rendering the manufacturing process further complicated. In addition, due to the arrangement such as the one described above, there are many cases where a data line and a power line become located in proximity to or intersect each other, in which case a drawback arises in that the resolution declines due to the jumping in of noise from the power line to the data line. In accordance with this embodiment, however, as already described, the arrangement adopted is such that the light-emitting elements emit light in a direction perpendicular to the direction of lamination thereof, and the photoelectric conversion devices receive light at their surfaces facing in a direction perpendicular to the direction of lamination (the direction of film deposition of the photoconductive layer 3) thereof. Accordingly, unlike the conventional arrangement, the three light-emitting elements are not juxtaposed in the main scanning direction (in a direction perpendicular to the plane of the drawing in FIG. 34) in the same plane for each picture element. Moreover, since the light-emitting elements are not juxtaposed in the same plane in the above-described manner, portions of the wiring do not intersect each other unlike the conventional arrangement. Hence, the cases of the jumping in of the noise from the power line to the data line can be reduced by that portion, so that reliable driving can be obtained, and the photoelectric conversion devices can be made compact and become easy to manufacture.

Figure 35:
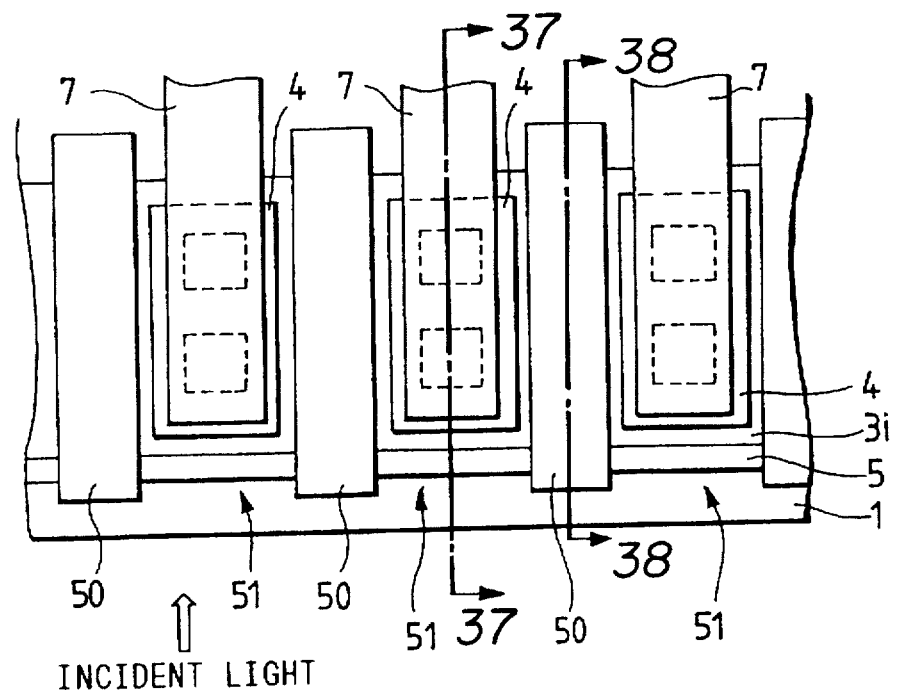
FIG. 35 is a plan view of a 10th embodiment of the photoelectric conversion devices in accordance with the present invention.
Figure 36:
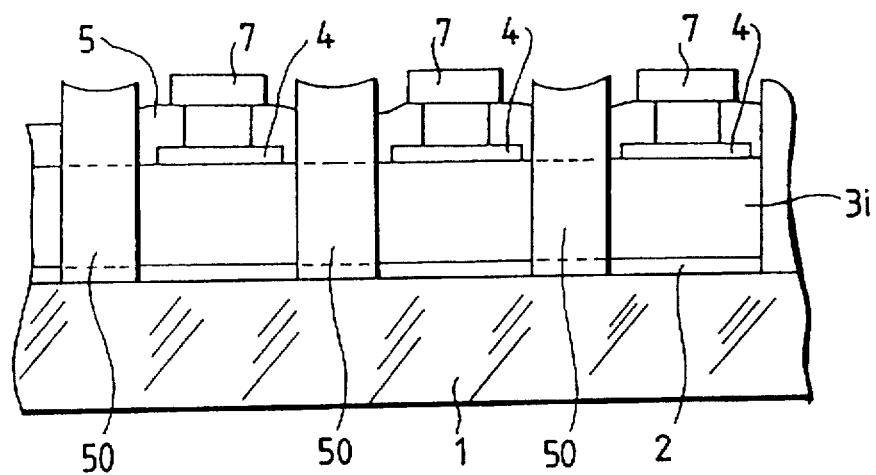
FIG. 36 is a front elevational view of the photoelectric conversion devices in the 10th embodiment.
Figure 37:
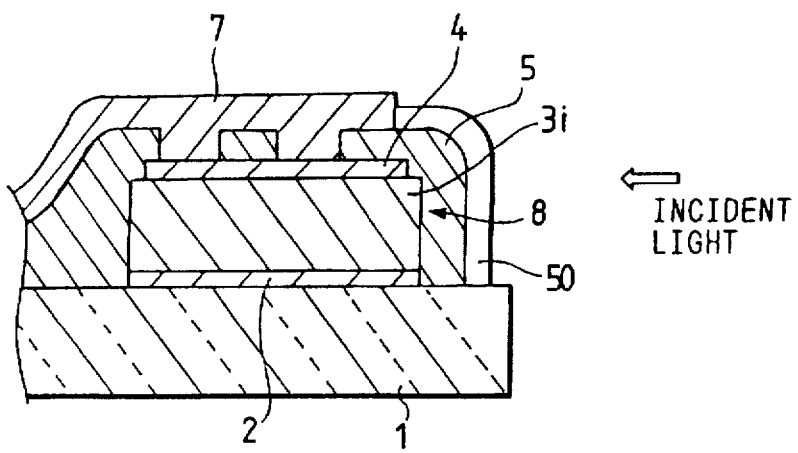
FIG. 37 is a cross-sectional view taken along line L—L in FIG. 35.
Figure 38:
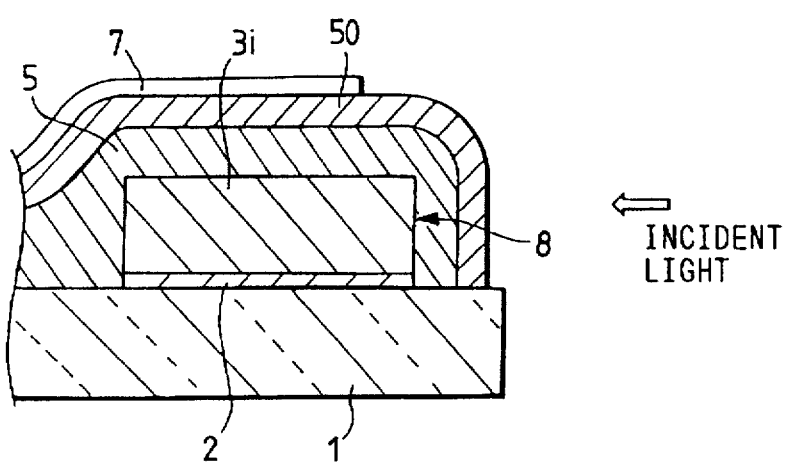
FIG. 38 is a cross-sectional view taken along line M—M in FIG. 35.

Next, FIGS. 35 to 38 show a 10th embodiment, in which FIG. 35 is a plan view of the photoelectric conversion devices of this embodiment, FIG. 36 is a front elevational view of the photoelectric conversion devices, FIG. 37 is a cross-sectional view taken along line L—L in FIG. 35, and FIG. 38 is a cross-sectional view taken along line M—M in FIG. 35. In this embodiment as well, the same constituent elements as those of the first embodiment will be denoted by the same reference numerals, and a description thereof will be omitted. Hereafter, a description will be given centering on differences.

This embodiment is characterized in that, in an assembly in which a plurality of photoelectric conversion devices are juxtaposed, the photoconductive layer constituting a part of each photoelectric conversion device is not provided in a discrete manner for each photoelectric conversion device in the manner shown in the first embodiment, but is formed in a continuous manner.

Specifically, a photoconductive layer 3i of this embodiment is formed in the configuration of a strip in the same way as the insulating substrate 1, and is arranged such that the direction of its longitudinal axis agrees with that of the insulating substrate 1. In addition, a light-shielding layer 50 is formed between adjacent ones of the photoelectric conversion devices so as to prevent an effect of diffraction or the like of the light to be made incident upon an adjacent photoelectric conversion device. That is, the light-shielding layer 50 is arranged such that, for instance, an aluminum film having a thickness of 1 to 2 μm is deposited on the surface of the insulating layer 5. This light-shielding layer 50 is arranged along the direction of the transverse axis of the insulating substrate 1 in the photoelectric conversion device, and a portion thereof opposing the light-receiving surface 8 is formed as an opening 51. Accordingly, the incident light (outline arrow in FIGS. 35, 37, and 38) reflected from the original document (not shown) is made incident upon the light-receiving surface 8 through the opening 51, and the light which should essentially be made incident upon an adjacent photoelectric conversion device is prevented from being made incident upon an area through adjacent ones of the photoelectric conversion devices by means of the light-shielding layer 50. For this reason, the adjacent ones of the photoelectric conversion devices do not affect each other, so that the resolution improves.

A description will be given of the process of manufacturing the photoelectric conversion devices of this embodiment through a comparison with a conventional arrangement in which the photoconductive layers are formed discretely, e.g. the one shown in the first embodiment. In the case of this embodiment, a photoconductive film is deposited in a manner similar to that described in the first embodiment, and the photoconductive film, together with the second electrode 4, is subjected to patterning by using the same resist pattern, thereby completing the formation of the photoconductive layer 3i.

Meanwhile, in the photoelectric conversion devices having the structure of the first embodiment shown in FIGS. 6 to 8, after the second electrode 4 is subjected to patterning into a predetermined configuration, the photoconductive layer 3 is subjected to patterning by the dry etching process by using the same resist pattern. Furthermore, a process has been required in which a portion of the constituent material of the second electrode 4, such as aluminum, which projects in the form of eaves as a result of side etching in this etching, is removed by wet etching by using the same resist pattern. In the production of the photoelectric conversion devices of this embodiment, these processes are not required at all. Accordingly, thanks to a reduction in the number of processes, production can be effected in a shorter period than in the conventional method. For that reason, in an original-document reading unit using the photoelectric conversion devices of this embodiment, the cost of the unit can be lowered. It should be noted that the light-shielding layer 50 is preferably set in a grounded state in view of the prevention of electrification.

Figure 39:
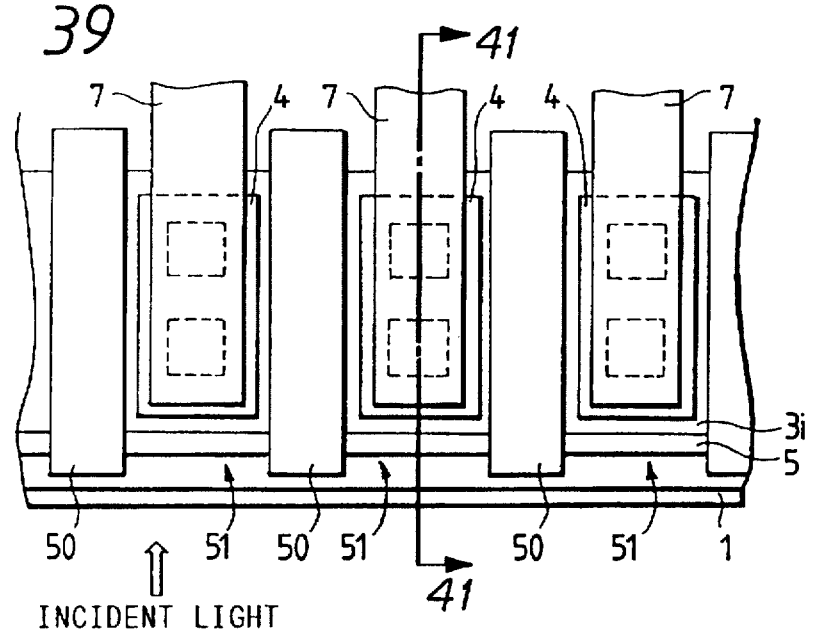
FIG. 39 is a plan view of an 11th embodiment of the photoelectric conversion devices in accordance with the present invention.
Figure 40:
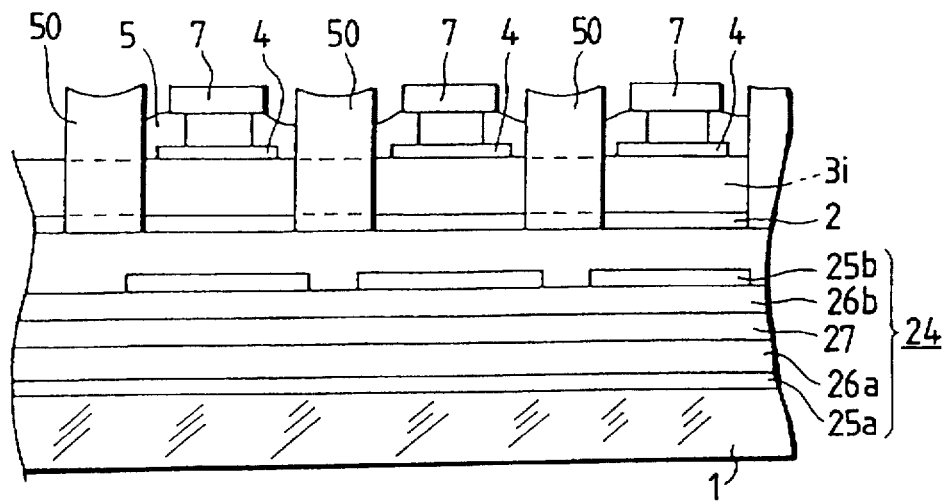
FIG. 40 is a front elevational view of the photoelectric conversion devices in the 11th embodiment.
Figure 41:
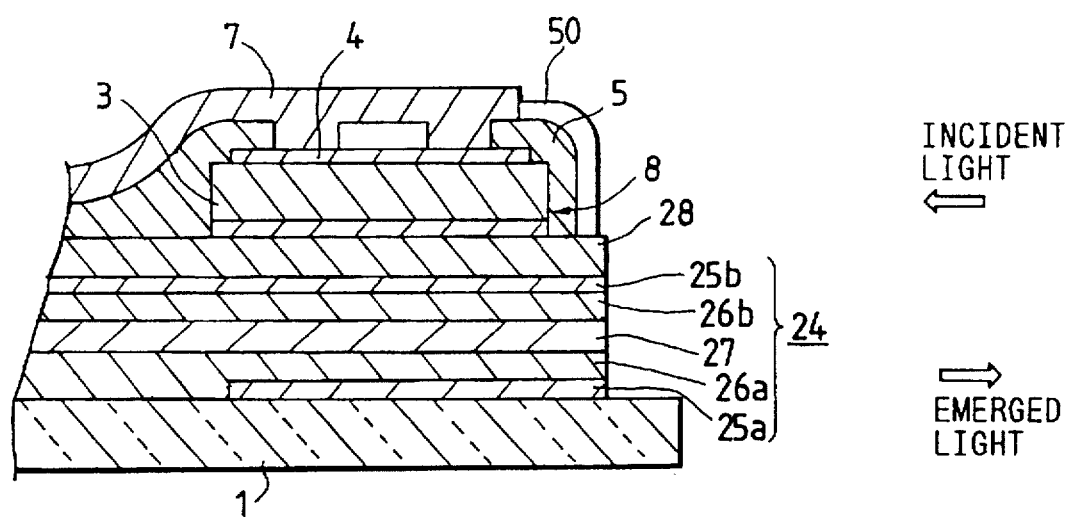
FIG. 41 is a cross-sectional view taken along line N—N in FIG. 39.

Next, as an 11th embodiment, an arrangement in which a light-emitting element is formed integrally with the photoelectric conversion devices in the above-described 10th embodiment is shown in FIGS. 39 to 41. Hereafter, a description will be given of the photoelectric conversion devices of this embodiment with reference to the drawings. It should be noted that the same constituent elements as those of the first and 10th embodiments will be denoted by the same reference numerals, and a description will be omitted. Below, a description will be given centering on differences. FIG. 39 is a plan view of the photoelectric conversion devices of this embodiment, FIG. 40 is a front elevational view of the photoelectric conversion devices of this embodiment, and FIG. 41 is a cross-sectional view taken along line N—N in FIG. 39.

This embodiment is basically arranged in a manner similar to that of the seventh embodiment shown in FIGS. 23 to 26. That is, the light-emitting element 24 is formed on the insulating substrate 1, and the photoelectric conversion devices of the above-described 10th embodiment are formed on the upper surface thereof, thereby integrating the same with the light-emitting element. By adopting this arrangement, it is possible to provide a full-contact-type image sensor which makes it unnecessary to provide an optical system separately from the photoelectric conversion devices.

Figure 42:
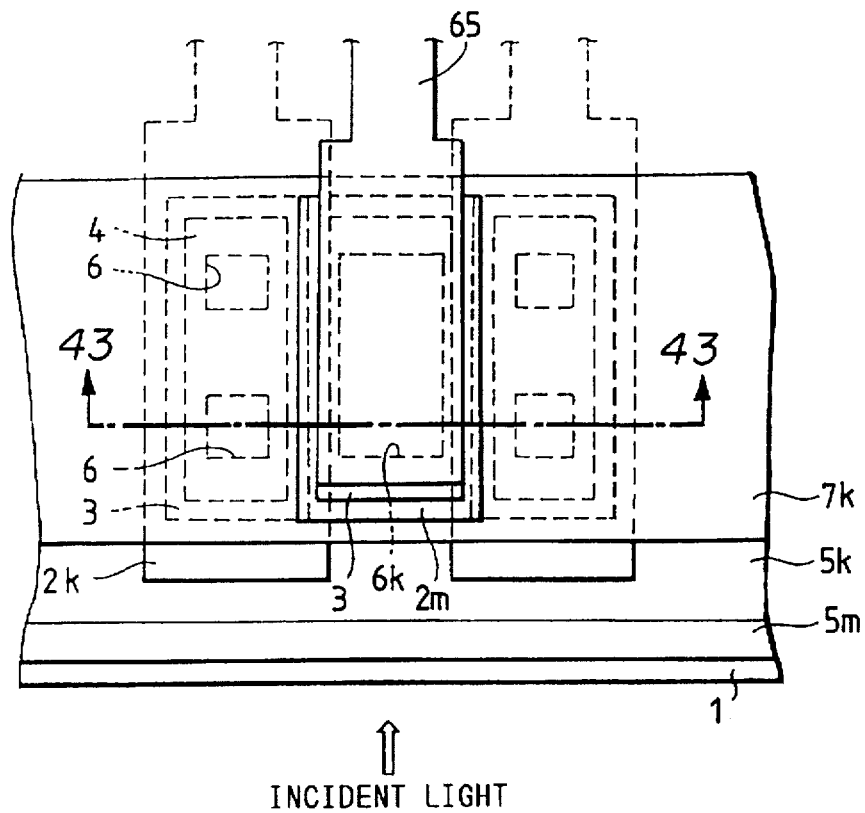
FIG. 42 is a plan view of the photoelectric conversion devices in accordance with a 12th embodiment.
Figure 43:
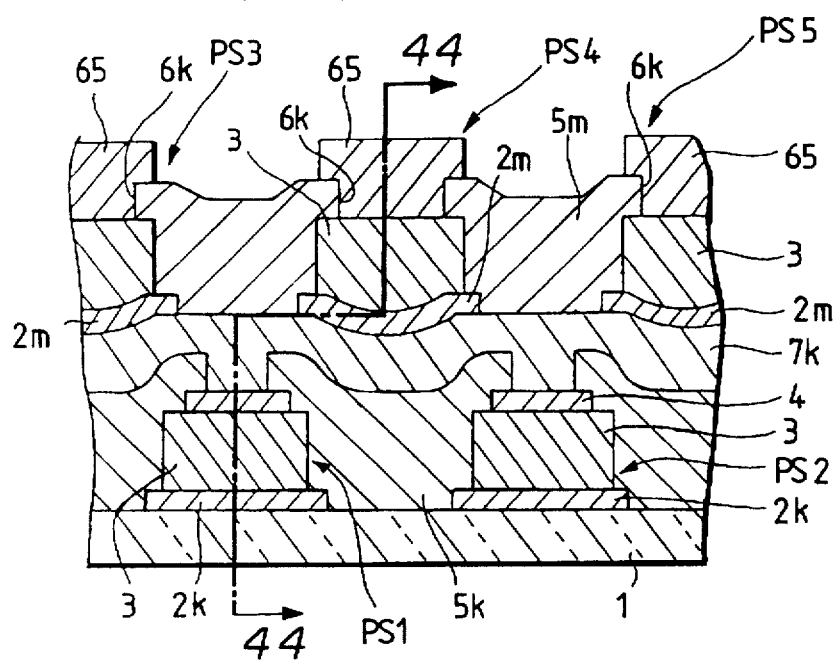
FIG. 43 is a cross-sectional view taken along P—P in FIG. 42.
Figure 44:
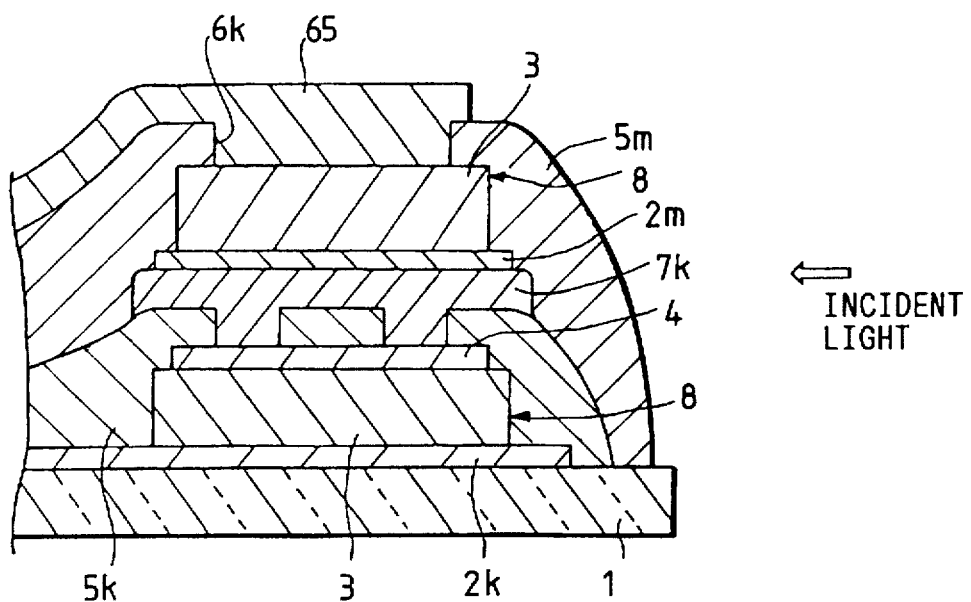
FIG. 44 is a cross-sectional view taken along Q—Q in FIG. 43.

As a 12th embodiment, FIGS. 42 to 44 show an arrangement in which the photoelectric conversion devices are formed in two layers so as to enhance the sensitivity and resolution. FIG. 42 is a plan view of the photoelectric conversion devices of this embodiment, FIG. 43 is a cross-sectional view taken along line P—P in FIG. 42, and FIG. 44 is a cross-sectional view taken along Q—Q in FIG. 43. It should be noted that, in this embodiment as well, the same constituent elements as those of the first embodiment will be denoted by the same reference numerals, and a description thereof will be omitted. Below, a description will be given centering on differences.

This embodiment is arranged such that upper photoelectric conversion devices (PS3–PS5 in FIGS. 42 and 44) are laminated on (at an upper position in FIG. 43) lower photoelectric conversion devices (PS1, PS2 in FIGS. 42 and 44) arranged at predetermined intervals, and the upper photoelectric conversion devices, when viewed in a horizontal direction (horizontally in FIGS. 42 and 43), are arranged in such a way as to be located between the respective lower photoelectric conversion devices. Accordingly, if it is assumed that the center lines of the respective light-receiving surfaces are connected together, that line becomes zigzag.

Figure 3:
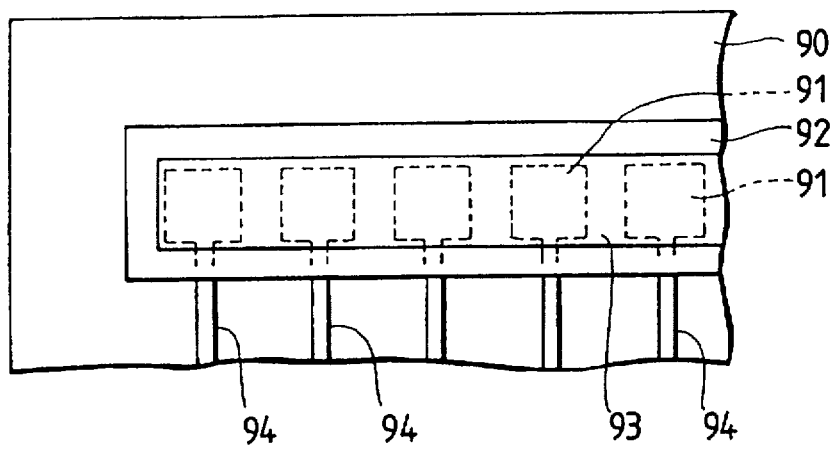
FIG. 3 is a schematic plan view illustrating a conventional photoelectric conversion device array.
Figure 4:
FIG. 4 is a schematic plan view illustrating the arrangement of filters of a color image sensor using one row of a photoelectric conversion device array.
Figure 5:
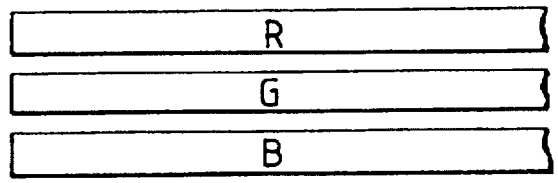
FIG. 5 is a schematic plan view illustrating the arrangement of filters of a color image sensor in which the photoelectric conversion device arrays are provided in a multiplicity of rows.

The lower photoelectric conversion devices PS1, PS2 are basically arranged in the same manner as the photoelectric conversion devices shown in the first embodiment (see FIGS. 6 to 8), but the difference lies in the fact that a third electrode 7k extends in the horizontal direction and serves as a common constituent element for the respective lower photoelectric conversion devices PS1, PS2. In addition, the respective lower photoelectric conversion devices PS1, PS2 are disposed at predetermined intervals in the horizontal direction (horizontally in FIG. 3), and these intervals are the same as those for the first embodiment shown in, for instance, FIGS. 6 to 8.

The upper photoelectric conversion devices PS3, PS4, PS5 each comprise an upper-layer first electrode 2m disposed on an upper surface (the surface away from the surface joined to an insulating layer 5k in FIG. 43) of the third electrode 7k in such a manner as to be directly joined to the aforementioned third electrode 7k, the photoconductive layer 3 formed on this upper-layer first electrode 2m, and an upper-layer second electrode 65 connected to the photoconductive layer 3 via an insulating layer 5m. The photoelectric conversion devices of this embodiment differ from those shown in the first embodiment in that, with reference to the first embodiment, there is no constituent member corresponding to the second electrode 4 (see FIGS. 6 to 8), and that the upper-layer second electrode 65 corresponding to the third electrode 7 of the first embodiment is directly joined to the photoconductive layer 3. Furthermore, with reference to the example shown in FIG. 43, the upper photoelectric conversion device PS4 is disposed in such a manner as to be located exactly at an intermediate position between the lower photoelectric conversion devices PS1 and PS2 in the horizontal direction (horizontally in FIG. 43). It should be noted that each upper photoelectric conversion device is not necessarily required to be located at the intermediate position between adjacent ones of the lower photoelectric conversion devices in the manner shown in this embodiment. In addition, the upper-layer second electrode 2m is connected to the photoconductive layer 3 via a contact hole 6k formed in the insulating layer 5m.

Since the process of manufacturing the photoelectric conversion devices having the above-described arrangement is basically identical to that described in the first embodiment, a detailed description thereof will be omitted here.

In addition, the drawing out of signal lines from the photoelectric conversion devices of this embodiment to an external circuit is effected as follows: That is, as already described, the third electrode 7k is arranged to be used jointly for the lower photoelectric conversion devices and is, at the same time, joined to the first electrodes 2m with respect to the respective upper photoelectric conversion devices, so that an electric wire (not shown) connected to the third electrode 7k becomes a common line. Accordingly, in the upper photoelectric conversion devices, a bias voltage is constantly applied to the third electrode 7k, and charges, which are produced as the reflected light corresponding to the relative density of the original document (not shown) surface is made incident upon the upper photoelectric conversion devices, are fetched as output signals from the upper-layer second electrodes 65. In the lower photoelectric conversion devices, meanwhile, a bias voltage is constantly applied thereto from the third electrode 7k in the same way as the upper photoelectric conversion devices, and charges, which are produced as the reflected light corresponding to the relative density of the original document surface is made incident upon the lower photoelectric conversion devices, are fetched from first electrodes 2k as output signals in the same way as the upper photoelectric conversion devices.

In the above-described arrangement, if a comparison is made with the assembly in which a plurality of photoelectric conversion devices are disposed on the same straight line as shown in, for instance, the first embodiment, the upper photoelectric conversion devices are arranged in such a manner as to be located between adjacent ones of the lower photoelectric conversion devices and to be offset therefrom in a direction perpendicular to the direction of arrangement (in the horizontal direction in FIG. 43) of the lower photoelectric conversion devices. Hence, the light which cannot be totally or sufficiently captured by the lower photoelectric conversion devices can be received by the upper photoelectric conversion devices. For that reason, the sensitivity and resolution can be improved over the arrangement shown in the first embodiment.

Figure 45:
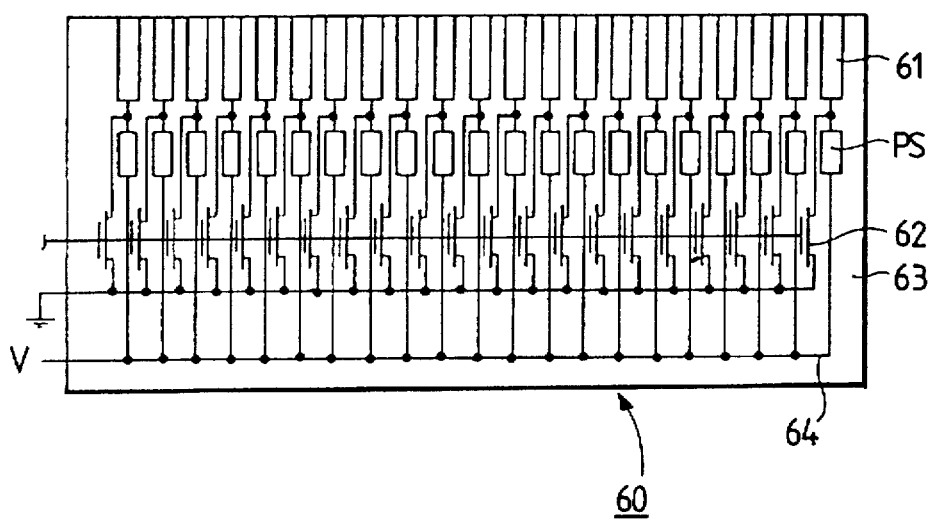
FIG. 45 is a schematic diagram illustrating a schematic arrangement of a marking head for an ion-projecting copying machine using the photoelectric conversion devices in accordance with the present invention.
Figure 46:
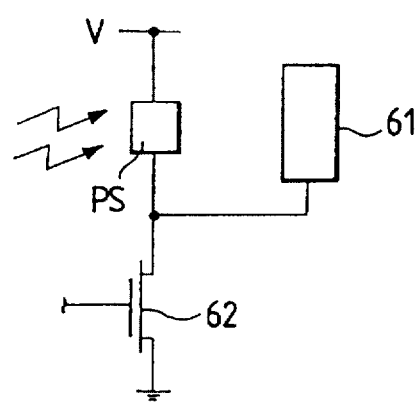
FIG. 46 is a circuit diagram illustrating the state of electrical connection of an element of the marking head.

Finally, an example of application of the photoelectric conversion devices which have hitherto been described is shown in FIGS. 45 and 46 as a 13th embodiment. Here, FIG. 45 is a schematic diagram illustrating a schematic arrangement of a marking head for an ion-projecting copying machine, and FIG. 46 is a circuit diagram illustrating the state of electrical connection per element of an array constituting the marking head shown in FIG. 45.

First, as the photoelectric conversion devices used in this applied example, any of those which have already been described may be used, with the exception of those in which the light-emitting element is formed integrally therewith. As particularly preferable photoelectric conversion devices, it is possible to cite, for instance, the photoelectric conversion devices in the first embodiment shown in FIGS. 6 to 8, those in the second embodiment shown in FIGS. 10 and 11, those in the third embodiment shown in FIG. 12, and those in the sixth embodiment shown in FIGS. 19 to 21.

This embodiment is an example in a case where the photoelectric conversion devices in accordance with the present invention are used as light-receiving elements constituting the so-called marking head for use in the ion-projecting copying machine.

Since the structure and operation of the ion-projecting copying machine are already publicly well-known (e.g. see Japanese Patent Application Laid-Open No. 89069/1987, for example), a detailed description will be omitted here.

The marking head constitutes a part of the ion-projecting copying machine, and since this is also publicly well-known, a detailed description will be omitted here. A schematic arrangement thereof is shown in FIG. 45, and the schematic arrangement will be described below with reference to the drawing.

In the drawing, a marking head 60 of this embodiment is arranged such that a plurality of modulating electrodes 61, the photoelectric conversion devices PS of a number identical to that of the modulating electrodes 61, and thin-film transistors (hereafter referred to as the "TFTs") of a number similarly identical to that of the photoelectric conversion devices PS, and so on are formed integrally on an insulating substrate 63. As is well-known, the photoelectric conversion devices PS receive the reflected light from an unillustrated original document, and cause an applied voltage to the modulating electrodes 61 to change in response to a change in continuity resistance, thereby imparting a change to the density of an ion current passing the vicinity of the modulating electrodes 61. It should be noted that FIG. 45 does not show an actual mechanical arrangement, and strictly serves as an illustration for describing the arrangement of the marking head.

In this embodiment, the photoelectric conversion devices PS are disposed on an end face of the substrate 63, although an arrangement thereof is not shown in the drawing, and the photoelectric conversion devices PS are adapted to be capable of receiving light from a direction (a direction parallel with the substrate 63) perpendicular to the direction of film deposition of a photoconductive layer (not shown).

The operation of the marking head 60 will be schematically given with reference to FIG. 45. FIG. 45 shows electrical connections in the elements constituting the marking head 60, in which the photoelectric conversion device PS and the TFT 62 are connected in series, one end of the photoelectric conversion device PS is connected to a power supply line (voltage V), the source of the TFT 62 is grounded, and the gate thereof is connected to an unillustrated clock generator.

In addition, the other end of the photoelectric conversion device PS, the drain of the TFT 62, and the modulating electrode 61 are all connected to each other.

The clock generator generates a clock signal of a predetermined period, and its signal is inputted to the gate of the TFT 62. Then, when this clock signal is inputted to the TFT 62, the TFT is set in an energized state, so that the modulating electrode 61 is held at the ground potential irrespective of the operation of the photoelectric conversion device PS. Meanwhile, in a case where the clock signal is not inputted to the TFT 62, and light is being made incident upon the photoelectric conversion device PS, the photoelectric conversion device PS exhibits a continuity resistance corresponding to the amount of incident light, so that a voltage inversely proportion to the continuity resistance of that photoelectric conversion device PS is applied to the modulating electrode 61.

Accordingly, as is well-known, the value of a voltage applied to the modulating electrode 61 changes in response to the operation of the photoelectric conversion device PS, i.e., in correspondence with the presence or absence of reflected light from the original document (not shown) and in response to the relative intensity of that light. As a result, a necessary change is imparted to the density of an ion current whose passage is located in the vicinity of the modulating electrode 61.

Thus, if a comparison is made between cases where the conventional photoelectric conversion devices and the photoelectric conversion devices in accordance with the present invention are used as the light-receiving elements of the marking head 60, first, in the conventional marking head, the light-receiving elements are arranged to receive light in a direction perpendicular to the substrate 63, and a minimum area of each of the light-receiving surfaces is a 5 to 10 μm square at best. Hence, in the marking head of this type in which a multiplicity of modulating electrodes and light-receiving elements need to be arranged in the form of arrays, the size of the marking head in a plan view becomes a size of a certain measure, so that there have been limitations to the effort in reducing the size of the substrate.

However, in the case where the photoelectric conversion devices in accordance with the present invention are used, the direction parallel with the substrate is made an optical path of the incident light, as already described. In particular, the direction perpendicular to the substrate 63 is a direction of film deposition of the photoconductive layer. Since the processing accuracy in that direction is approximately one-tenth or thereabouts of the processing accuracy of the conventional light-receiving surface, as already described, the total area and the total volume which it occupies become sufficiently smaller than in the conventional case, thereby facilitating a reduction in the size of the substrate.

In addition, as described with reference to FIG. 9 and the like, since the optical path can be made parallel with the substrate, it is possible to arrange an optical system such as a SELFOC lens or the like, so that the apparatus can be made thin.

In accordance with the present invention, a photoconductive layer is disposed between opposing electrodes and a direction perpendicular to the direction of film deposition of this photoconductive layer is set as a direction of incidence of light, and a surface of the photoconductive layer facing in that direction is set as a light-receiving surface. Accordingly, since the accuracy of fine processing in the direction of film deposition of the photoconductive layer is approximately one-tenth or thereabouts of the minimum fine processing accuracy in a conventional light-receiving surface, i.e., the surface facing in the direction of film deposition of the photoconductive layer, it is possible to provide a photoelectric conversion device whose resolution is improved by that portion. In addition, since the surface facing in the direction perpendicular to the direction of film deposition of the photoconductive layer is set as the light-receiving surface, in a substrate on which the photoelectric conversion devices are disposed, each light-receiving surface becomes perpendicular to the substrate, and the photoconductive layer can be made long in a direction parallel with the substrate and in the direction of incidence of the light. Accordingly, it is possible to readily improve the light absorbing-efficiency, so that it is possible to provide high-sensitivity photoelectric conversion devices. Furthermore, since the plurality of light-receiving surfaces are arranged in such a manner that a phantom line connecting these light-receiving surfaces becomes zigzag, it becomes possible to receive such light that is made incident upon an area between adjacent light-receiving surfaces and that has hitherto been impossible to capture at a position laterally offset from a line where the adjacent light-receiving surfaces are juxtaposed. Hence, the present invention offers an outstanding advantage in that the sensitivity and resolution can be further improved.

Figure 47:
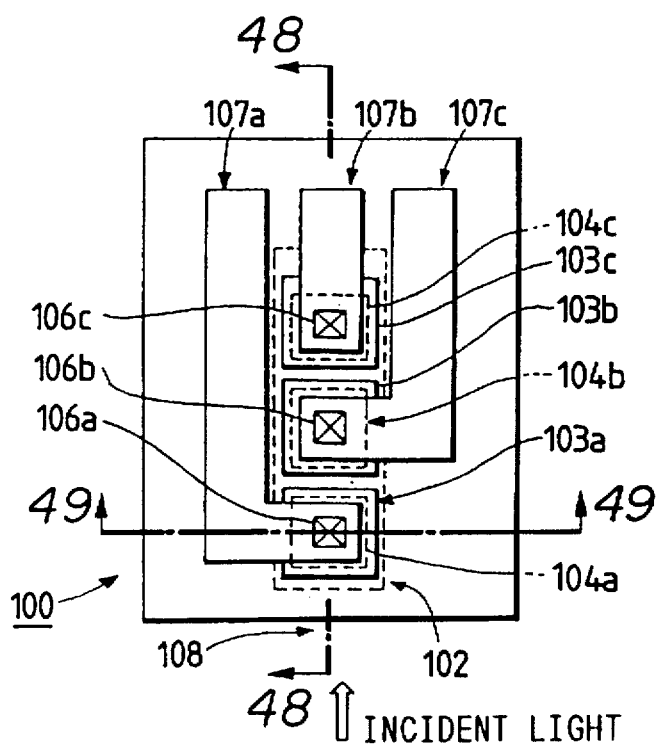
FIG. 47 is a schematic diagram illustrating a plan view of a first embodiment of a multi-color photoelectric conversion device of the present invention.
Figure 48:
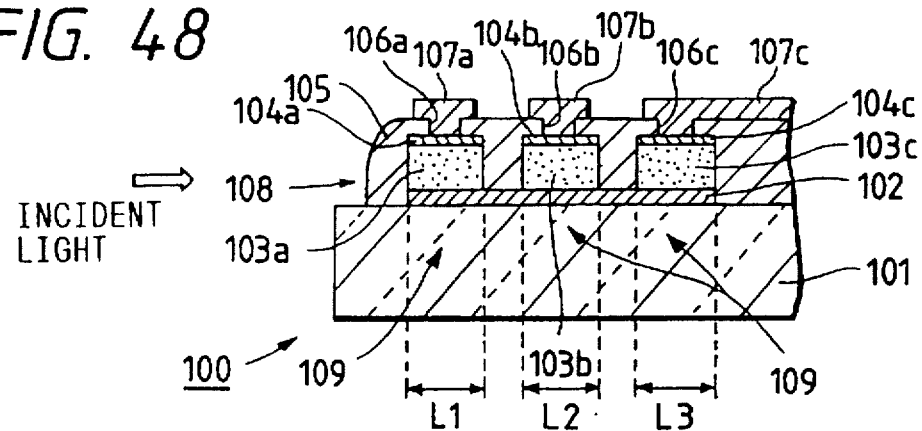
FIG. 48 is a schematic cross-sectional view taken along line A—A in FIG. 47.
Figure 49:
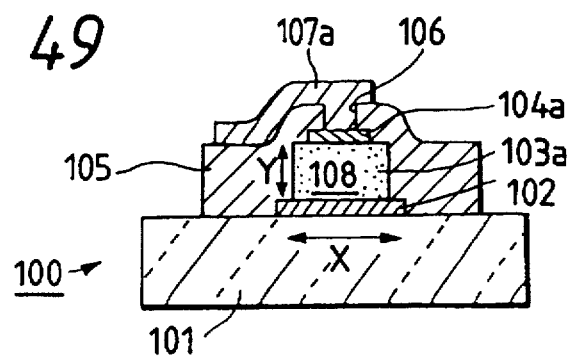
FIG. 49 is a schematic cross-sectional view taken along line B—B in FIG. 47.

Embodiments of a multi-color photoelectric conversion device for use in an image input means to read a color image will be described hereinbelow. Referring to FIGS. 47 to 49, a description will be given of one picture-element portion of the multi-color photoelectric conversion device in accordance with the present invention. FIG. 47 is a plan view of the multi-color photoelectric conversion device in accordance with an embodiment, FIG. 48 is a cross-sectional view taken along line A—A in FIG. 47, and FIG. 49 is a cross-sectional view taken along line B—B in FIG. 47.

The multi-color photoelectric conversion device in accordance with this embodiment is arranged such that three photoelectric conversion devices 109, 109, 109 are disposed along the direction of incidence of light, the photoelectric conversion devices 109, 109, 109 comprising an insulating substrate 101 composed of a material such as glass; a lower electrode 102 formed of a metal, such as chromium, formed on the insulating substrate 101 in a rectangular configuration in which a direction parallel with the direction of incidence of the light is set as its long side; three photoconductive layers 103a, 103b, 103c formed separately on this lower electrode 102; upper electrodes 104a, 104b, 104c formed of a metal, such as aluminum, and respectively disposed on the photoconductive layers 103a, 103b, 103c in face-to-face relation with the lower electrode 102; and an insulating layer 105 composed of an insulating material, such as a polyimde, for covering the aforementioned lower electrode 102, the upper electrodes 104, and the photoconductive layers 103. The lower electrodes 102 and the like constituting the multi-color photoelectric conversion device of this embodiment are formed by being consecutively subjected to film deposition and patterning on the aforementioned insulating substrate 101. In addition, the upper electrodes 104a, 104b, 104c are connected to lead wires 107a, 107b, 107c via contact holes 106a, 106b, 106c provided in the insulating layer 105.

In this embodiment, one end face 108 (see FIGS. 9 and 10) of the photoconductive layer 103a appearing in the direction of its longitudinal axis is set as a light-receiving surface upon which light from the surface of an original document is made incident. As shown by the outline arrow in FIG. 47 or 48, the incident light is adapted to be made incident upon this light-receiving surface 108. Then, as for the light made incident upon the light-receiving surface, part thereof is absorbed as the light passes through the photoconductive layer 103a, and is introduced to the photoconductive layer 103a via the transparent insulating layer 105, and the light which was not absorbed is further introduced to the photoconductive layer 103b.

Here, the processing accuracy of a horizontal length X of the light-receiving surface 108 in FIG. 49 is determined substantially by photolithography and etching accuracy since processing such as patterning in this direction (details will be described later) is performed by photolithography and etching. Meanwhile, the processing accuracy of a vertical length Y (X>Y) of the light-receiving surface 108 is determined substantially by a method of film deposition of the photoconductive layer 103 (details will be described later), and that accuracy can be made high in the vicinity of 0.1 to 0.5 μm, which is approximately one-tenth of the processing accuracy of X.

Next, a description will be given of the process of manufacturing the above-described photoelectric conversion devices.

First, the insulating substrate 101 of this embodiment is formed by using a glass member, as a specific example of this member, for example, Corning 7059 is used. Then, a film of chromium (Cr) with a thickness of 500 to 1000 Å is deposited on the overall surface of this insulating substrate 101 by a sputtering process. Subsequently, this chromium film is subjected to patterning into a predetermined configuration (a rectangular configuration whose side parallel with the direction of incidence of light is a long side) by a photolithographic process, thereby forming the lower electrode 102.

Then, a photoconductive layer is deposited on the overall surface by a plasma CVD process in such a manner as to cover the lower electrode 102. The photoconductive layer of this embodiment is composed of p-i-n-type amorphous silicon hydride (a-Si:H), and the p-layer is prepared by subjecting a silane (SiH$_4$) gas to 1% doping with a diborane (B$_2$H$_6$) gas; the i-layer is prepared by using only the silane (SiH$_4$) gas; and the n-layer is prepared by subjecting the silane (SiH$_4$) gas to doping with a phosphine (PH$_3$) gas. It should be noted that the temperature of film deposition in the plasma CVD process in this embodiment is set to 200° to 250° C., and as for the thicknesses of the aforementioned p-, i-, and n-layers, the thicknesses of the p- and n-layers are set to 200 to 1000 Å or thereabouts, while the thickness of the i-layer is set to 1 to 20 μm or thereabouts.

Subsequent to the formation of the photoconductive film, an aluminum (Al) film of 500 to 1000 Å or thereabouts is deposited by the sputtering process or the vacuum deposition process. Then, the upper electrodes 104a, 104b, 104c are respectively formed by being patterned into a predetermined configuration, i.e., into the configuration of three islands disposed separately on the lower electrode 102 in this embodiment.

Next, the photoconductive film formed earlier is subjected to patterning by dry etching by using the same resist pattern used in the aforementioned upper electrodes 104, thereby forming the photoconductive layers 103a, 103b, 103c whose planar configurations are slightly larger than those of the upper electrodes 104a, 104b, 104c. In this dry etching, portions projecting from the upper electrodes 104a, 104b, 104c in the manner of eaves are produced during side etching, and these portions are removed by providing wet etching by using the same resist pattern as the one used in dry etching.

Then, a roller coating or a spin coating of a polyimide (e.g. PIX-1400 or PIX-8803 made by Hitachi Chemical Co., Ltd. or Photoneece made by Toray Industries, Inc.) with a thickness of 1 to 5 μm thereabouts is formed thereon by the vacuum deposition process or the sputtering process, thereby forming the insulating layer 105. The contact holes 106 are formed at positions where the upper electrodes 104 are disposed by means of the photolithographic process. Finally, an aluminum (Al) film is deposited by the sputtering process or the vacuum deposition process, and is subjected to patterning into a predetermined configuration by the photolithographic process so as to form the lead wires 107a, 107b, 107c, thereby completing a multi-color photoelectric conversion device 110.

It should be noted that although, in the multi-color photoelectric conversion device 110 in accordance with this embodiment, the photoconductive layers 103a, 103b, 103c are of the p-i-n type, they may be of an i-type. In addition, as the material for forming the upper electrodes 104, indium tin oxide (ITO), chromium (Cr), or the like may be used instead of aluminum used in this embodiment. As the material for forming the insulating layer 105, silicon nitride (SiN$_x$), silicon oxide (SiO$_2$), SiN$_x$O$_y$, or the like may be used instead of the polyimide used in this embodiment. Furthermore, as the material for forming the lower electrodes 102, the upper electrodes 104, and the lead wires 107, a metal such as tantalum (Ta), molybdenum (Mo), nickel (Ni), tungsten (W), or the like may be used. As the material for forming the photoconductive layers 103, an a-Si compound, CdS, CdSe, an organic semiconductor, or the like, may be used.

Figure 50:
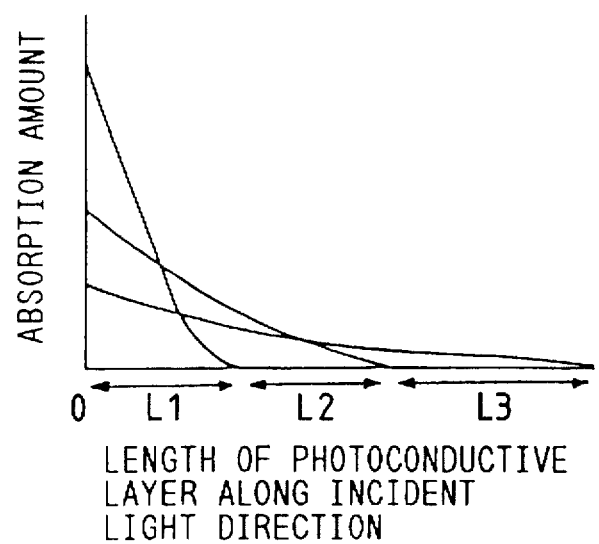
FIG. 50 is a graph illustrating the light-absorption characteristics of each photoconductive layer of the multi-color photoelectric conversion device.

By virtue of the above-described arrangement, as the three photoelectric conversion devices 109 are disposed along the direction of incidence of light, it is possible to obtain the multi-color photoelectric conversion device 110 in which the distances of end faces of the photoconductive layers 103a, 103b, 103c of the photoelectric conversion devices 109 from the light-receiving surface 108 differ. That is, white light made incident upon the light-receiving surface 108, when passing through the photoconductive layer 103a of the first photoelectric conversion device 109, is absorbed in dependence on the light-absorbing coefficient of the photoconductive layer 103a, while the light which was not absorbed consecutively reaches the photoconductive layers 103a, 103b of the second and third photoelectric conversion devices 109. The shorter the wavelength, the greater the light-absorbing coefficient, with the result that the lengths of the photoconductive layers 103 along the direction of incidence of the light and necessary for the absorption of light vary depending on short-wavelength light (blue light), medium-wavelength light (green light), and long-wavelength light (red light), as shown in FIG. 50. Accordingly, by adjusting lengths L1, L2, L3 of the photoconductive layers 103a, 103b, 103c along the direction of incidence of light, all the short-wavelength light can be absorbed by the first photoelectric conversion device 109, all the medium-wavelength light can be absorbed by the second photoelectric conversion device 109, and all the long-wavelength light can be absorbed by the third photoelectric conversion device 109. In accordance with the multi-color photoelectric conversion device 110 in which the lengths of the respective photoconductive layers 103 are thus set, if the amounts of incident light of the respective colors corresponding to the short-wavelength light (blue light), the medium-wavelength light (green light), and the long-wavelength light (red light) are respectively assumed to be C1, C2, and C3, output signals S1, S2, S3 extracted from the lead electrodes 107a, 107b, 107c of the photoelectric conversion devices 109 can be expressed by the following formulae:

$$S1 = C1 + \alpha C2 + \beta C3$$
$$S2 = (1-\alpha)C2 + \beta'C3$$
$$S3 = (1-\beta-\beta')C3$$

That is, the signals of the short-wavelength light (blue light), medium-wavelength light (green light), and long-wavelength light (red light) are mixed in the output signal S1, the signals of the medium-wavelength light (green light) and the long-wavelength light (red light) are mixed in the output signal S2, and only the signal of the long-wavelength light (red light) is included in the output signal S3. Accordingly, after the signals are fetched from the lead wires 107a, 107b, 107c, if calculations for obtaining C1, C2, C3 are performed by a signal processing circuit, it is possible to calculate the amounts of incident light corresponding to the respective colors, thereby obtaining color-separated image signals. It should be noted that $\alpha$, $\beta$, and $\beta'$ are constants attributable to the amounts of absorption calculated on the basis of the absorption coefficients of the respective colors in the photoconductive layers.

Figure 51:
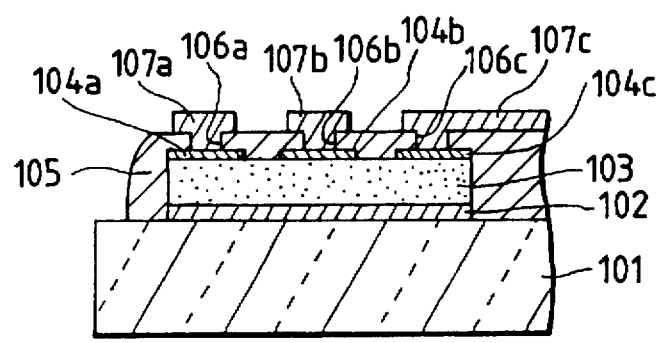
FIG. 51 is a schematic cross-sectional view illustrating another embodiment of the multi-color photoelectric conversion device.

FIG. 51 shows another embodiment in which the photoconductive layer 103 is formed continuously in the photoelectric conversion devices 109. Since the amorphous silicon hydride constituting the photoconductive layer 103 has a high heat resistance value, even if the photoconductive layer 103 is made common to the photoelectric conversion devices 109 constituting the multi-color photoelectric conversion device 110, the signals extracted from the lead wires 107a, 107b, 107c of the photoelectric conversion devices 109 do not become mixed. Since the other arrangements are similar to those shown in FIG. 48, identical constituent parts will be denoted by the same reference numerals, and a description thereof will be omitted. In accordance with this embodiment, since there is no need for the photoconductive layer 103 to be provided with fine etching, it is possible to improve the yield and simplify the manufacturing process.

In FIGS. 52 to 55, the multi-color photoelectric conversion devices are juxtaposed in the form of arrays to constitute an image reading unit. Portions having identical arrangements as those shown in FIGS. 47 to 49 are denoted by the same reference numerals.

That is, a multiplicity of multi-color photoelectric conversion devices 110 shown in FIGS. 47 to 49 are juxtaposed in the main scanning direction, and the lead wires 107a, 107b, 107c are arranged in the form of strips for the respective photoelectric conversion devices 109 corresponding to the respective colors of light and arrayed parallel with the main scanning direction. Amplifiers 111 are connected to these lead wires 107a, 107b, 107c, respectively, and signals are adapted to be extracted therefrom via the amplifiers 111. In addition, a voltage is adapted to be applied to the lower electrode 102 of the multi-color photoelectric conversion devices 110 via switching devices SW.

Figure 55:
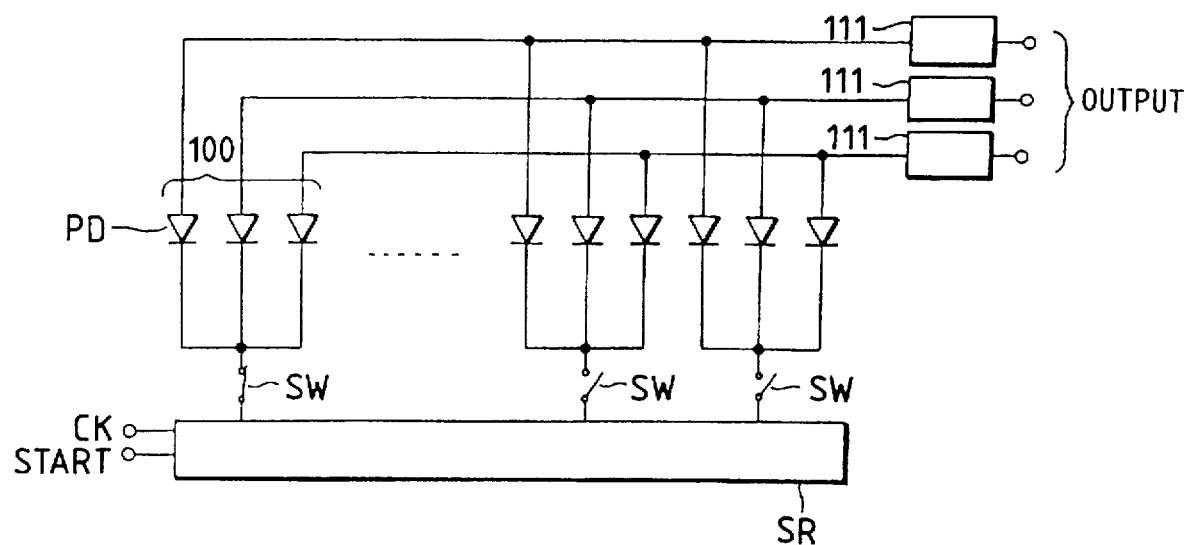
FIG. 55 is an equivalent circuit diagram of the image reading unit shown in FIG. 52.

In an equivalent circuit of the above-described image reading unit, the other ends of the switching devices SW are connected to terminals of a shift register SR, as shown in FIG. 55. In addition, the anode sides (upper electrode 107 sides) of photodiodes PD which equivalently express the photoelectric conversion devices 109 are connected to common signal lines for the respective photoelectric conversion devices 109 corresponding to the respective colors of light and arrayed parallel with the main scanning direction, and output signals are adapted to be extracted therefrom via the amplifiers 111. The shift register SR is provided with a data terminal-DATA and a clock terminal CK, data pulses inputted from the data terminal DATA are shifted, and are consecutively outputted from the respective terminals of the shift register SR as driving pulses.

Referring to the equivalent circuit shown in FIG. 55, a description will be given of the reading operation of this image reading unit.

That is, reflected light from the surface of an original document (not shown) is applied to each photodiode PD which has already been electrically charged, and a photoelectric current proportional to the amount of applied light flows into the anode side of the photodiode PD, thereby discharging the charge stored in the photodiode PD (storage period). Subsequently, the switching device SW is set in the closed state, and a driving pulse is applied from the shift register SR, thereby resetting the cathode voltage at the photodiode PD to a fixed value (signal reading period). Accordingly, a charge of an amount equivalent to the positive charge at the cathode electrode which has flown out as a photoelectric current during the storage period is replenished (recharged) by the signal reading operation. As replenished portions of these charges are respectively detected from the signal lines (upper electrodes) common to the respective colors via the amplifiers 111 as sensor currents, it is possible to obtain color-separated image signal outputs. The above-described operation is performed each time a driving pulse is consecutively applied from each terminal of the shift register SR with respect to the multi-color photoelectric conversion devices arranged in the main scanning direction, so that the color-separated image signals for one line on the original document can be respectively obtained in a time series.

Figure 52:
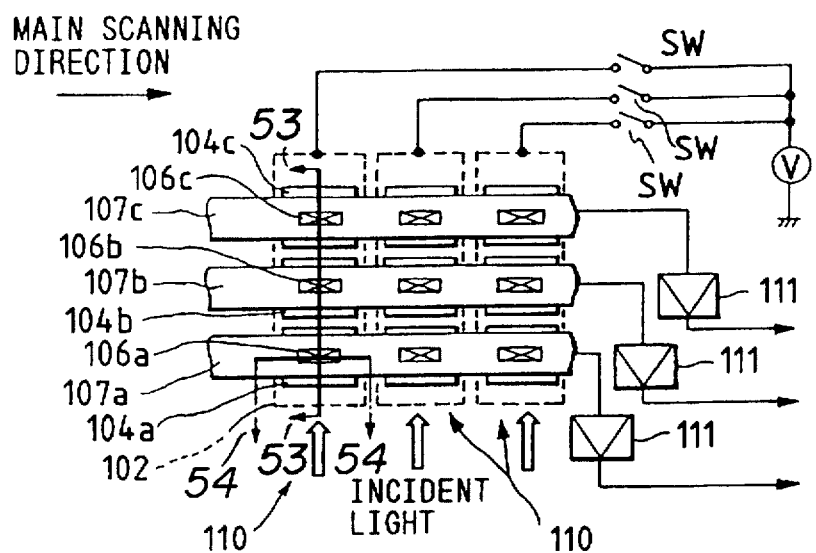
FIG. 52 is a schematic structural diagram illustrating a part of an image reading unit in which a plurality of multi-color photoelectric conversion devices are arrayed.
Figure 53:
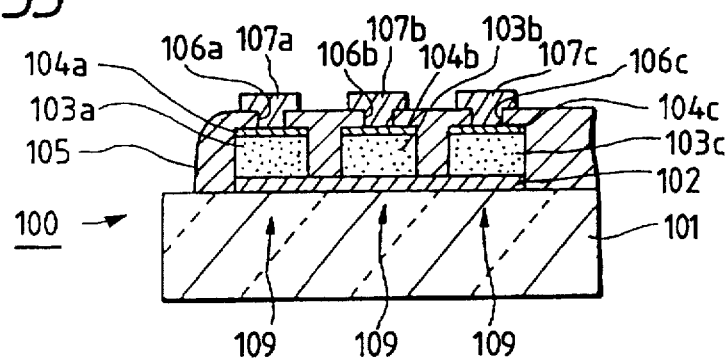
FIG. 53 is a schematic cross-sectional view taken along line C—C in FIG. 52.
Figure 54:
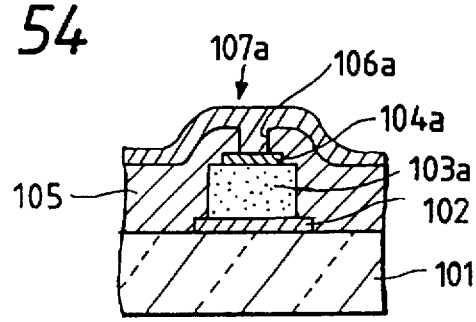
FIG. 54 is a schematic cross-sectional view taken along line D—D in FIG. 52.
Figure 56:
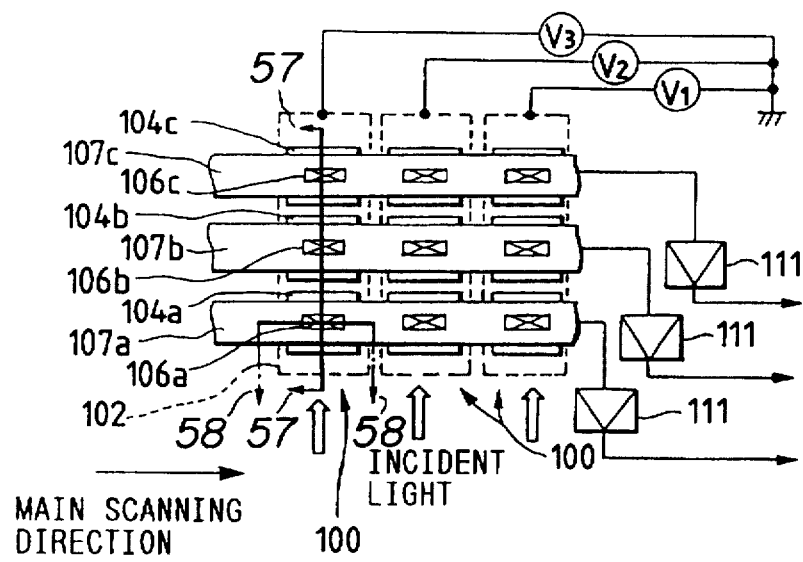
FIG. 56 is a schematic structural diagram illustrating another example of the image reading unit.
Figure 57:
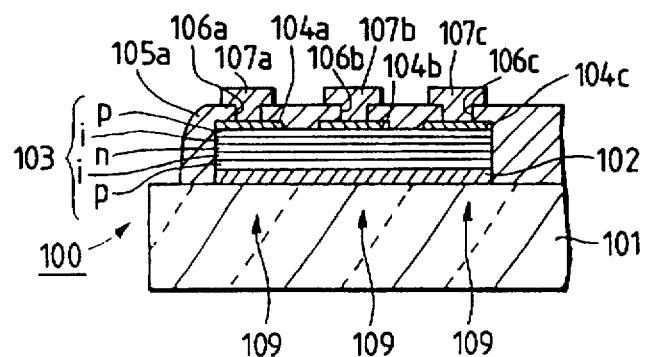
FIG. 57 is a schematic cross-sectional view taken along line E—E in FIG. 56.
Figure 58:
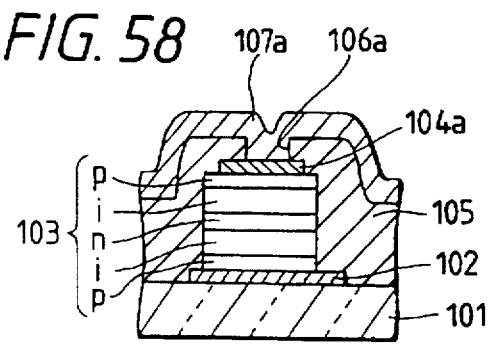
FIG. 58 is a schematic cross-sectional view taken along line F—F in FIG. 56.

FIGS. 56 and 57 show an image reading unit in accordance with another embodiment, in which the photoelectric conversion devices 109 are arranged by being connected in series in such a manner that the polarities of the photodiode PD and a blocking diode BD become mutually reverse. Parts which are arranged in the same manner as those shown in FIGS. 52 to 54 are noted by the same reference numerals. The p-layer, i-layer, n-layer, i-layer, and p-layer are consecutively laminated, the respective diodes are formed by the p-layer, i-layer, and n-layer in the upper and lower layers, and the n-layer is made common. As a result, it is possible to obtain a series connection of reverse polarities in which cathodes of the photodiode (upper side) and the blocking diode (lower side) are connected.

Figure 59:
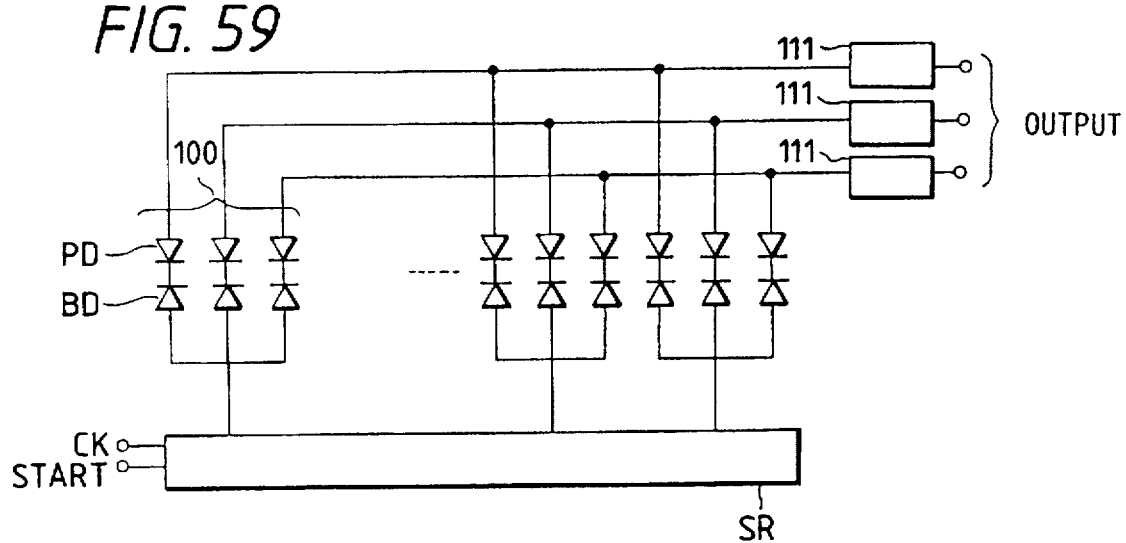
FIG. 59 is an equivalent circuit diagram of the image reading unit shown in FIG. 56.

As shown in FIG. 59, in the equivalent circuit of the above-described image reading unit, the anode sides (lower electrode 2 sides) of the blocking diodes BD constituting parts of the multi-color photoelectric conversion devices 110 are connected to the terminals of the shift register SR. In addition, the anode sides (upper electrode 4 sides) of the photo diodes PD are connected to the common signal lines for the respective photoelectric conversion devices 109 corresponding to the respective colors of light and arrayed parallel with the main scanning direction. The shift register SR is provided with the data terminal DATA and the clock terminal CK, data pulses inputted from the data terminal DATA are shifted, and are consecutively outputted from the respective terminals of the shift register SR as driving pulses.

Referring to FIG. 59 a description will be given of the signal reading operation.

That is, reflected light from the surface of an original document (not shown) is applied to each photodiode PD which has already been electrically charged, and a photoelectric current proportional to the amount of applied light flows into the anode side of the photodiode PD, thereby discharging the charge stored in the photodiode PD (storage period). Subsequently, a driving pulse is applied from the shift register SR to the anode side of the blocking diode BD, thereby biasing the blocking diode BD in a forward direction and resetting the cathode voltage between the diodes to a fixed value (signal reading period). Accordingly, a charge of an amount equivalent to the positive charge at the cathode electrode which has flown out as a photoelectric current during the storage period is replenished (recharged) by the signal reading operation. As replenished portions of these charges are respectively detected from the signal lines (upper electrodes) common to the respective colors via the amplifiers 11 as sensor currents, it is possible to obtain color-separated image signal outputs. The above-described operation is performed each time a driving pulse is consecutively applied from each terminal of the shift register SR with respect to the multi-color photoelectric conversion devices arranged in the main scanning direction, so that the color-separated image signals for one line on the original document can be respectively obtained in a time series.

Figure 60:
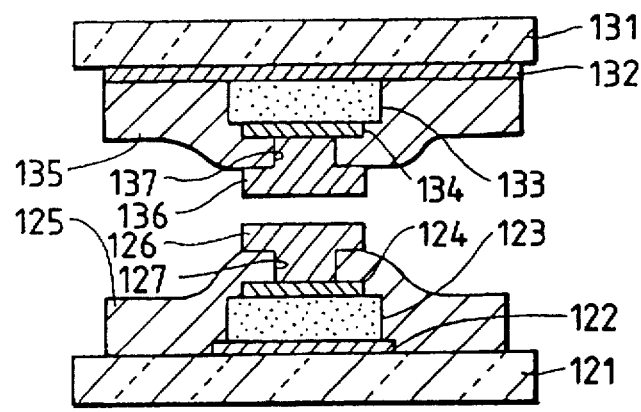
FIG. 60 is a schematic cross-sectional view illustrating another embodiment of the multi-color photoelectric conversion device used in the image reading unit shown in FIG. 56.
Figure 61:
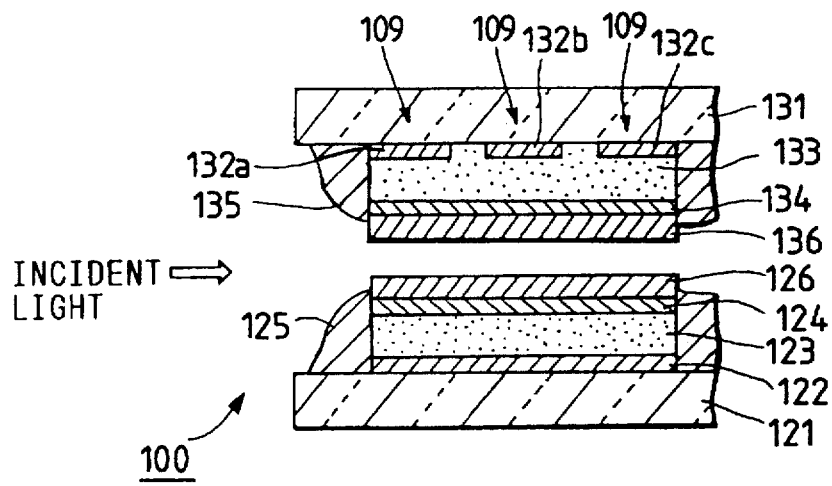
FIG. 61 is a schematic cross-sectional view of that multi-color photoelectric conversion device.

FIGS. 60 and 61 show another example of the multi-color photoelectric conversion device in which two diodes are connected with reverse polarities in series, in which two diodes are formed separately, and these are bonded together in face-to-face relation. The photoelectric conversion devices 109 corresponding to the respective colors are arranged along the direction of incidence of light, as shown in FIG. 61.

That is, formed on a first glass substrate 121 are a first electrode 122 common to the photoelectric conversion devices 109; a photoconductive layer 123 in which the p-layer, i-layer, and n-layer are consecutively laminated; a second electrode 124; a transparent insulating layer 125; and a bump-like electrode 126 where bump processing is provided. The bump-like electrode 126 is connected to the second electrode 124 via a contact hole 127 formed in the insulating layer 125. Formed on a second glass substrate 131 are first electrodes 132a, 132b, 132c separated for the respective photoelectric conversion devices; a photoconductive layer 133 in which the p-layer, i-layer, and n-layer are consecutively laminated; a second electrode 134; a transparent insulating layer 135; and a bump-like electrode 136. In the same way as the above-described structure, the bump-like electrode 136 is connected to the second electrode 134 via a contact hole 137 formed in the insulating layer 135. As the connection is made by causing the bump-like electrodes 126, 136 to abut against each other, the multi-color photoelectric conversion device 110 is arranged in which the diodes are connected with reverse polarities in series. In FIGS. 60 and 61, a state prior to joining is shown. In addition, instead of providing bump processing, they may be bonded together with a light-transmitting anisotropic photoconductive resin by forming a normal electrode. According to this embodiment, since the two diodes are fabricated separately, it is possible to improve the yield of the multi-color photoelectric conversion device 110 obtained by joining.

In accordance with the above-described embodiments, since the light-receiving surface 108 upon which the light from the original document surface is made incident is the end face side of the photoconductive layer 103a, the light-receiving surfaces of the photoelectric conversion devices 109 constituting the multi-color photoelectric conversion device 110 are side faces of the photoconductive layers 103a, 103b, 103c, respectively. The direction which is perpendicular to the direction of film deposition of the photoconductive layer 103 becomes the light-receiving surface. Accordingly, among the sides which define the light-receiving surface 108, the side in one direction is parallel with the direction of film deposition of the photoconductive layer 103, so that the fine processing accuracy of that side is determined by the deposition accuracy of the photoconductive layer. Since that accuracy can be made higher than the fine processing accuracy of a conventional light-receiving surface, i.e., the surface of the photoconductive layer in the deposition direction thereof, it is possible to enhance the resolution of the multi-color photoelectric conversion device 110.

In addition, since the photoelectric conversion devices 109 corresponding to the respective colors of light are arranged along the direction of incidence of light, and multi-color separation is effected by making use of the difference in color-absorption characteristics with respect to the respective colors of light in the photoconductive layers 103, it is possible to read multi-color image information simultaneously in the same light-receiving area. In addition, color filters for color separation and a light source for color-separating illumination such as those used in conventional examples are not required, so that it is possible to simplify the apparatus when used as an image reading unit.

In addition, it is possible to effect the reading of multi-color image information simultaneously in the same light-receiving area, it is possible to prevent the offset of the reading area due to the color separation, and the simplification of signal processing can be attained.

In accordance with the present invention, since the surface facing in a direction perpendicular to film deposition of the photoconductive layer is set as the light-receiving surface upon which light is made incident, the area of the light-receiving surface can be controlled by adjusting the thickness in the deposition direction when a photoconductive layer film is deposited. Hence, it is possible to render the light-receiving surface fine, and it is possible to obtain a high-resolution image sensor.

In addition, since the photoelectric conversion devices corresponding to the respective colors are arranged along the direction of incidence of light, and multi-color separation is effected by making use of the difference in the color-absorption characteristics with respect to the respective colors, it is possible to effect the reading of multi-color image information simultaneously in the same light-receiving area. In addition, color filters and a light source for color-separating illumination are made unnecessary, and it is possible to prevent the offset of a reading area due to color separation.

What is claimed is:

1. A photoelectric conversion device for image reading, comprising a photoconductive layer disposed between opposing electrodes, said photoconductive layer having a surface facing in a direction perpendicular to a direction of layer deposition of the photoconductive layer and acting as a light-receiving surface which receives a majority of incident light to be detected.

2. A photoelectric conversion device comprising a plurality of conversion elements each having a photoconductive layer disposed between opposing electrodes, each said photoconductive layer having a surface facing in a direction perpendicular to a direction of layer deposition of the photoconductive layer and acting as a light-receiving surface which receives a majority of incident light to be detected and the plurality of light-receiving surfaces are arranged in such a manner that a line connecting said plural light-receiving surfaces is of a zig-zag pattern.

3. A multi-color photoelectric conversion device comprising a plurality of conversion elements each having a photoconductive layer disposed between opposing electrodes, each said photoconductive layer having a surface facing in a direction perpendicular to a direction of layer deposition of the photoconductive layer and acting as a light-receiving surface which receives a majority of incident light to be detected.

4. The multi-color photoelectric conversion device as defined in claim 3 wherein said plurality of light-receiving surfaces are arranged in such a manner that a line connecting said plurality of light-receiving surfaces is of a zigzag pattern.

5. A photoelectric conversion device for image reading, comprising:

a photoelectric means having a first surface, a second surface opposing said first surface, and a third surface not parallel with said first and second surfaces;

a first electrode provided to said first surface; and a second electrode provided to said second surface, said third surface having a light receiving region which receives a majority of incident light to be detected.

6. The photoelectric conversion device as claimed in claim 5 wherein a second light receiving region is provided to one of said first and second surfaces.

7. The photoelectric conversion device as claimed in claim 5 further comprising a lens means provided in the vicinity of said light receiving region.

8. The photoelectric conversion device as claimed in claim 5 further comprising a light emitting means including an active layer and an electrode means which is provided in the vicinity of said light receiving region.

9. A photoelectric conversion device comprising:

a plurality of photoelectric conversion elements, each of which comprises a photoelectric means having a first surface, a second surface opposing said first surface, and a third surface not parallel with said first and second surfaces; a first electrode provided to said first surface; and a second electrode provided to said second surface, said third surface having a light receiving region which a receives majority of incident light to be detected, and the light receiving regions of respective said photoelectric conversion elements being parallel with respect to each other.

10. The photoelectric conversion device as claimed in claim 9 wherein the light receiving regions are arranged in a zigzag pattern.

11. A photoelectric device comprising:

a photoelectric means having a first surface, a second surface opposing said first surface, and a third surface not parallel with said first and second surfaces;

a plurality of first electrodes provided to said first surface; and a second electrode provided to said second surface, said third surface having a light receiving region which receives a majority of incident light to be detected and said plural first electrodes being arranged in a direction apart from said third surface.

12. The photoelectric conversion device as claimed in claim 11 wherein said photoelectric means comprises a plurality of photoelectric members to which said plural first electrodes are respectively provided.

* * * * *

UNITED STATES PATENT AND TRADEMARK OFFICE
CERTIFICATE OF CORRECTION

PATENT NO. :
DATED : 5,767,559
INVENTOR(S) : June 16, 1998
ITO et al.

It is certified that error appears in the above-indentified patent and that said Letters Patent is hereby corrected as shown below:

Title Page, Item [57], in the Abstract, lines 3-4, "phoconductive" should read --photoconductive--.

Claim 9, column 32, line 22, "a receives" should read --receives a--.

Signed and Sealed this

Twelfth Day of October, 1999

Q. TODD DICKINSON

*Attest:*

*Attesting Officer*     Acting Commissioner of Patents and Trademarks